US012512291B2

(12) United States Patent
Preikszas et al.

(10) Patent No.: US 12,512,291 B2
(45) Date of Patent: Dec. 30, 2025

(54) PARTICLE BEAM SYSTEM HAVING A MULTI-POLE LENS SEQUENCE FOR INDEPENDENTLY FOCUSING A MULTIPLICITY OF INDIVIDUAL PARTICLE BEAMS, AND ITS USE AND ASSOCIATED METHOD

(71) Applicant: Carl Zeiss MultiSEM GmbH, Oberkochen (DE)

(72) Inventors: Dirk Preikszas, Oberkochen (DE); Hans Fritz, Grabs (CH); András G. Major, Oberkochen (DE)

(73) Assignee: Carl Zeiss MultiSEM GmbH, Oberkochen (DE)

(*) Notice: Subject to any disclaimer, the term of this patent is extended or adjusted under 35 U.S.C. 154(b) by 476 days.

(21) Appl. No.: 17/898,808

(22) Filed: Aug. 30, 2022

(65) Prior Publication Data

US 2022/0415604 A1 Dec. 29, 2022

Related U.S. Application Data

(63) Continuation of application No. PCT/EP2021/025102, filed on Mar. 11, 2021.

(30) Foreign Application Priority Data

Mar. 20, 2020 (DE) ......................... 102020107738.6

(51) Int. Cl.
*H01J 37/141* (2006.01)
*H01J 37/153* (2006.01)
(Continued)

(52) U.S. Cl.
CPC .......... *H01J 37/141* (2013.01); *H01J 37/153* (2013.01); *H01J 37/21* (2013.01); *H01J 37/26* (2013.01); *H01J 2237/1532* (2013.01)

(58) Field of Classification Search
CPC ........ H01J 37/141; H01J 37/153; H01J 37/21; H01J 37/26; H01J 2237/1532; H01J 37/12;
(Continued)

(56) References Cited

U.S. PATENT DOCUMENTS 4,130,761 A 12/1978 Matsuda
4,153,843 A 5/1979 Pease
(Continued)

FOREIGN PATENT DOCUMENTS

CN 101103417 A 1/2008
CN 110192263 A 8/2019
(Continued)

OTHER PUBLICATIONS

Japanese Office Action, with translation thereof, for corresponding JP Appl No. 2022-556177, dated May 7, 2024.
(Continued)

*Primary Examiner* — David E Smith
*Assistant Examiner* — Christopher J Gassen
(74) *Attorney, Agent, or Firm* — Fish & Richardson P.C.

(57) ABSTRACT

A particle beam system includes a multiple beam particle source to generate a multiplicity of charged individual particle beams, and a multi-pole lens sequence with first and second multi-pole lens arrays. The particle beam system also includes a controller to control the multi-pole lenses of the multi-pole lens sequence so related groups of multi-pole lenses of the multi-pole lens sequence through which the same individual particle beam passes in each case altogether exert an individually adjustable and focussing effect on the respective individual particle beam passing therethrough.

21 Claims, 17 Drawing Sheets

(51) Int. Cl.
*H01J 37/21* (2006.01)
*H01J 37/26* (2006.01)

(58) Field of Classification Search
CPC . H01J 2237/1534; H01J 2237/21; H01J 37/28
See application file for complete search history.

(56) References Cited

U.S. PATENT DOCUMENTS

| | | | | |
|---|---|---|---|---|
| 4,200,794 | A | 4/1980 | Newberry | |
| 4,338,548 | A | 7/1982 | Bono | |
| 4,742,234 | A | 5/1988 | Feldman | |
| 5,215,623 | A | 6/1993 | Takahashi | |
| 5,864,142 | A | 1/1999 | Muraki | |
| 5,892,224 | A | 4/1999 | Nakasuji | |
| 5,905,267 | A | 5/1999 | Muraki | |
| 5,981,954 | A | 11/1999 | Muraki | |
| 6,107,636 | A | 8/2000 | Muraki | |
| 6,124,599 | A | 9/2000 | Muraki | |
| 6,137,113 | A | 10/2000 | Muraki | |
| 6,323,499 | B1 | 11/2001 | Muraki | |
| 6,333,508 | B1 | 12/2001 | Katsap | |
| 6,617,595 | B1 | 9/2003 | Okunuki | |
| 6,633,366 | B2 | 10/2003 | de Jager | |
| 6,696,371 | B2 | 2/2004 | Butschke | |
| 6,787,780 | B2 | 9/2004 | Hamaguchi | |
| 6,804,288 | B2 | 10/2004 | Haraguchi | |
| 6,818,911 | B2 | 11/2004 | Tamamori | |
| 6,835,508 | B2 | 12/2004 | Butschke | |
| 6,872,950 | B2 | 3/2005 | Shimada | |
| 6,903,345 | B2 | 6/2005 | Ono | |
| 6,903,353 | B2 | 6/2005 | Muraki | |
| 6,917,045 | B2 | 7/2005 | Hashimoto | |
| 6,919,574 | B2 | 7/2005 | Hashimoto | |
| 6,943,349 | B2 | 9/2005 | Adamec | |
| 6,953,938 | B2 | 10/2005 | Iwasaki | |
| 6,992,290 | B2 | 1/2006 | Watanabe | |
| 7,005,658 | B2 | 2/2006 | Muraki | |
| 7,015,467 | B2 | 3/2006 | Maldonado | |
| 7,060,984 | B2 | 6/2006 | Nagae | |
| 7,084,411 | B2 | 8/2006 | Lammer-Pachlinger | |
| 7,091,504 | B2 | 8/2006 | Wieland | |
| 7,109,494 | B2 | 9/2006 | Ono | |
| 7,126,141 | B2 | 10/2006 | Ono | |
| 7,129,502 | B2 | 10/2006 | Kruit | |
| 7,244,949 | B2 | 7/2007 | Knippelmeyer | |
| 7,285,779 | B2 | 10/2007 | Litman | |
| 7,375,326 | B2 | 5/2008 | Sender | |
| 7,420,164 | B2 | 9/2008 | Nakasuji | |
| 7,468,507 | B2 | 12/2008 | Rogers | |
| 7,504,622 | B2 | 3/2009 | Elyasaf | |
| 7,535,001 | B2 | 5/2009 | Sender | |
| 7,554,094 | B2 | 6/2009 | Knippelmeyer et al. | |
| 7,601,972 | B2 | 10/2009 | Nakasuji | |
| 7,619,203 | B2 | 11/2009 | Elyasaf | |
| 7,696,497 | B2 | 4/2010 | Rogers | |
| 8,035,082 | B2 | 10/2011 | Yamazaki | |
| 8,134,135 | B2 | 3/2012 | Kruit | |
| 8,350,214 | B2 | 1/2013 | Otaki | |
| 8,362,425 | B2 | 1/2013 | Han | |
| 8,384,051 | B2 | 2/2013 | Ozawa | |
| 8,598,525 | B2 | 12/2013 | Zeidler | |
| 8,618,496 | B2 | 12/2013 | Wieland | |
| 8,704,192 | B2 | 4/2014 | Sano | |
| 8,748,842 | B2 | 6/2014 | Ohashi | |
| 8,779,399 | B2 | 7/2014 | Yamanaka | |
| 8,829,465 | B2 | 9/2014 | Tsunoda | |
| 8,963,099 | B2 | 2/2015 | Yamada | |
| 9,153,413 | B2 | 10/2015 | Almogy | |
| 9,263,233 | B2 | 2/2016 | Zeidler | |
| 9,336,981 | B2 | 5/2016 | Knippelmeyer | |
| 9,336,982 | B2 | 5/2016 | Zeidler | |
| 9,349,571 | B2 | 5/2016 | Kemen | |
| 9,368,314 | B2 | 6/2016 | Nakasuji | |
| 9,530,613 | B2 | 12/2016 | Rogers | |
| 9,536,702 | B2 | 1/2017 | Lang | |
| 9,607,805 | B2 | 3/2017 | Liu | |
| 9,620,328 | B1 * | 4/2017 | Cook .................... | H01J 37/147 |
| 9,653,254 | B2 | 5/2017 | Zeidler | |
| 9,702,983 | B2 | 7/2017 | Eder | |
| 9,922,796 | B1 | 3/2018 | Frosien et al. | |
| 9,922,799 | B2 | 3/2018 | Li | |
| 9,991,089 | B2 | 6/2018 | Mueller | |
| 10,062,541 | B2 | 8/2018 | Ren | |
| 10,141,160 | B2 | 11/2018 | Ren | |
| 10,354,831 | B2 | 7/2019 | Kemen | |
| 10,388,487 | B2 | 8/2019 | Zeidler | |
| 10,535,494 | B2 | 1/2020 | Zeidler | |
| 10,541,112 | B2 | 1/2020 | Schubert | |
| 10,586,677 | B1 | 3/2020 | Okada | |
| 10,600,613 | B2 | 3/2020 | Zeidler | |
| 10,622,184 | B2 | 4/2020 | Knippelmeyer | |
| 10,643,820 | B2 | 5/2020 | Ren | |
| 10,741,355 | B1 | 8/2020 | Zeidler | |
| 10,811,215 | B2 | 10/2020 | Zeidler | |
| 10,854,423 | B2 | 12/2020 | Sarov | |
| 10,879,031 | B2 | 12/2020 | Ren | |
| 10,896,800 | B2 | 1/2021 | Riedesel | |
| 2006/0289804 | A1 | 12/2006 | Knippelmeyer et al. | |
| 2007/0181806 | A1 * | 8/2007 | Nakano ................. | H01J 37/153<br>250/310 |
| 2009/0014649 | A1 | 1/2009 | Nakasuji | |
| 2011/0297826 | A1 | 12/2011 | Madokoro et al. | |
| 2014/0197325 | A1 | 7/2014 | Kato | |
| 2015/0287568 | A1 | 10/2015 | Rodgers et al. | |
| 2016/0217233 | A1 | 7/2016 | Kamon et al. | |
| 2017/0025241 | A1 | 1/2017 | Li et al. | |
| 2017/0133198 | A1 | 5/2017 | Kruit | |
| 2017/0287674 | A1 * | 10/2017 | Knippelmeyer ....... | B82Y 40/00 |
| 2017/0309449 | A1 | 10/2017 | Ren et al. | |
| 2018/0218878 | A1 | 8/2018 | Xu et al. | |
| 2019/0287754 | A1 | 9/2019 | Ikegami et al. | |
| 2019/0333732 | A1 | 10/2019 | Ren | |
| 2019/0362928 | A1 | 11/2019 | Inoue et al. | |
| 2020/0211810 | A1 | 7/2020 | Zeidler | |
| 2020/0243300 | A1 | 7/2020 | Zeidler | |
| 2020/0373116 | A1 | 11/2020 | Zeidler | |
| 2021/0005423 | A1 | 1/2021 | Zeidler | |
| 2021/0035773 | A1 | 2/2021 | Zeidler | |

FOREIGN PATENT DOCUMENTS

| | | | |
|---|---|---|---|
| DE | 10 2013 014 976 | A1 | 3/2015 |
| DE | 10 2014 008 083 | A1 | 12/2015 |
| DE | 10 2018 007 652 | A1 | 4/2020 |
| EP | 2149897 | A1 | 2/2010 |
| GB | 2519511 | A | 4/2015 |
| GB | 2521819 | A | 7/2015 |
| JP | 59184524 | A | 10/1984 |
| JP | 60042825 | A | 3/1985 |
| JP | 60105229 | A | 6/1985 |
| JP | 61263217 | A | 11/1986 |
| JP | H02-65117 | A | 3/1990 |
| JP | 2000-243337 | A | 9/2000 |
| JP | 2008-091827 | A | 4/2008 |
| JP | 2008-210571 | A | 9/2008 |
| JP | 2009-531855 | A | 9/2009 |
| JP | 2014229481 | A | 12/2014 |
| JP | 2015-032380 | A | 2/2015 |
| JP | 2015-106518 | A | 6/2015 |
| JP | 2015-111571 | A | 6/2015 |
| JP | 2018-513543 | A | 5/2018 |
| JP | 2018-520495 | A | 7/2018 |
| JP | 2019-506006 | A | 2/2019 |
| JP | 2019-204694 | A | 11/2019 |
| WO | WO 2005/024881 | A2 | 3/2005 |
| WO | WO 2007/028595 | A2 | 3/2007 |
| WO | WO 2007/028596 | A2 | 3/2007 |
| WO | WO 2007/060017 | A2 | 5/2007 |
| WO | WO2007111603 | A1 | 10/2007 |
| WO | WO 2011/124352 | A1 | 10/2011 |
| WO | WO2013032949 | A1 | 3/2013 |
| WO | WO2016145458 | A1 | 9/2016 |
| WO | WO2017114794 | A1 | 7/2017 |
| WO | WO 2019/173170 | A1 | 9/2019 |

(56) References Cited

FOREIGN PATENT DOCUMENTS

| | | | |
|---|---|---|---|
| WO | WO2020057678 | A1 | 3/2020 |
| WO | WO2020064035 | A1 | 4/2020 |
| WO | WO2020065094 | A1 | 4/2020 |
| WO | WO2020070074 | A1 | 4/2020 |
| WO | WO2020151904 | A2 | 7/2020 |
| WO | WO2020249147 | A1 | 12/2020 |

OTHER PUBLICATIONS

International Search Report and Written Opinion for corresponding PCT Appl No. PCT/EP2021/025102, mailed Jun. 24, 2021.
Vinayakumar K B et al.: "Waferscale Electrostatic Quadrupole Array for Multiple Ion Beam Manipulation", arxiv.org, Cornell University Library, 201 Olin Library Cornell University Ithaca, NY 14853, Feb. 7, 2018.
Japanese Office Action, with translation thereof, for corresponding JP Appl No. 2022-556177, dated Oct. 31, 2023.
Office Action in Chinese Appln. No. 202180022773.8, mailed on Dec. 28, 2024, 16 pages (with English translation).
Office Action in Chinese Appln. No. 202180022773.8, mailed on Jun. 4, 2025, 9 pages (with English translation).
Search Report in Chinese Appln. No. 202180022773.8, mailed on Dec. 23, 2024, 5 pages (with English translation).

* cited by examiner

PARTICLE BEAM SYSTEM HAVING A MULTI-POLE LENS SEQUENCE FOR INDEPENDENTLY FOCUSING A MULTIPLICITY OF INDIVIDUAL PARTICLE BEAMS, AND ITS USE AND ASSOCIATED METHOD

CROSS-REFERENCE TO RELATED APPLICATIONS

The present application is a continuation of, and claims benefit under 35 USC 120 to, international application PCT/EP2021/025102, filed Mar. 11, 2021, which claims benefit under 35 USC 119 of German Application No. 10 2020 107 738.6, filed Mar. 20, 2020. The entire disclosure of these applications are incorporated by reference herein.

FIELD

The disclosure relates to particle beam systems which operate with a multiplicity of particle beams.

BACKGROUND

Just like single-beam particle microscopes, multi-beam particle microscopes can be used to analyse objects on a microscopic scale. Images of an object that represent a surface of the object, for example, can be recorded using these particle microscopes. In this way, for example the structure of the surface can be analysed. While in a single-beam particle microscope a single particle beam of charged particles, such as, for example, electrons, positrons, muons or ions, is used to analyse the object, in a multi-beam particle microscope, a plurality of particle beams are used for this purpose. The plurality of particle beams, also referred to as a bundle, are directed at the surface of the object at the same time, as a result of which a significantly larger area of the surface of the object can be sampled and analysed as compared with a single-beam particle microscope within the same period of time.

WO 2005/024 881 A2 discloses a multiple particle beam system in the form of an electron microscopy system which operates with a multiplicity of electron beams in order to scan an object to be examined using a bundle of electron beams in parallel. The bundle of electron beams is generated by an electron beam generated by an electron source being directed at a multi-aperture plate having a multiplicity of openings. One portion of the electrons of the electron beam impinges the multi-aperture plate and is absorbed there, and another portion of the beam passes through the openings in the multi-aperture plate, and so an electron beam is shaped in the beam path downstream of each opening, the cross section of the electron beam being defined by the cross section of the opening. Furthermore, suitably chosen electric fields provided in the beam path upstream and/or downstream of the multi-aperture plate have the effect that each opening in the multi-aperture plate can act as a lens on the electron beam passing through the opening, and so the electron beams are focussed in a plane situated at a distance from the multi-aperture plate. The plane in which the foci of the electron beams are formed can be imaged by a downstream optical unit onto the surface of the object to be examined, such that the individual electron beams impinge the object in a focussed manner as primary beams. There they generate interaction products, such as backscattered electrons or secondary electrons, emanating from the object, which are shaped to form secondary beams and are directed at a detector by a further optical unit. There each of the secondary beams can impinge a separate detector element such that the electron intensities detected by the detector element provide information relating to the object at the location at which the corresponding primary beam impinges the object. The bundle of primary beams can be scanned systematically over the surface of the object in order to generate an electron micrograph of the object in the manner that is customary for scanning electron microscopes.

In the multiple particle beam system described, a high resolution and a high throughput are, in general, highly relevant for the satisfactory and successful use in practice. In this case it is often desirable to largely reduce various types of imaging aberrations that occur. The reduction of imaging aberrations away from the optical axis of the system is usually desirable in the case of multiple particle beam systems, for example, so that a relatively high resolution can be achieved for all individual particle beams.

The field curvature imaging aberration generally becomes even more relevant with increasing number of individual particle beams used or with increasing size of the field of view (FOV) of a multiple particle beam system. In the case of field curvature, foci of the individual particle beams are typically located in a plane are imaged onto a (convexly) curved area. Thus, imaging may not be implemented exactly onto the object plane throughout, with this imaging aberration generally becoming larger for individual particle beams located further away from the optical axis of the system.

There are known approaches for reducing the field curvature.

When individual particle beams are generated via a multi-lens array, the individual particle beams can pass through a multi-aperture arrangement in which the round apertures have different diameters (cf. U.S. Pat. No. 7,554,094 B2). Specifically, the diameter d of the apertures can increase with increasing distance from the optical axis of the system or with increasing distance from the central aperture. The increase in the diameter can reduce the refractive power of the corresponding lens and there is an increase in the focal length for the individual particle beam. Consequently, the foci of the individual particle beams can be located on a concavely curved area in the case of an appropriate choice of the aperture diameters, as a result of which a (convex) field curvature subsequently generated by the further imaging can be compensated. However, this type of correction may not work without a replacement of the multi-lens array in the case of altered working points of the particle beam system.

A further approach for correcting field curvature lies in dividing the multi-lens array into zones where slightly different voltages are applied to the lenses in order to set the focal length of groups of individual particle beams. However, this approach generally exhibits relatively limited accuracy or represents an approximate solution.

Moreover, in the German patent application with the application number DE 10 2018 007 652.1 (publication number DE 10 2018 007 652 A1), which was not yet laid open at the priority date of this patent application, the applicant and its legal predecessor proposed the use of multi-lens arrays with a multiplicity of individually adjustable and focussing controllable particle lenses for correcting field curvature. The disclosure of DE 10 2018 007 652.1 is incorporated in the entirety thereof in this application. Here, the particle lenses comprise ring electrodes. Alternatively, instead of the ring electrodes the use of azimuthally subdivided electrodes such as quadrupoles or octupoles is proposed, to be precise with an identical voltage applied to all electrodes.

US 2015/0 287 568 A1 discloses a multiple particle beam system with improved beam focussing. To this end, astigmatic particle beams are generated in targeted fashion via quadrupole lenses and the imaging geometry thereof is analysed, allowing conclusions to be drawn about the best-possible focus setting of the non-astigmatic beams.

US 2017/0 309 449 A1 discloses a particle beam system, wherein an astigmatism to be impressed on particle beams is adaptable in a targeted manner. To this end, use is made of multi-pole pairs, which are arranged sequentially with respect to one another and, for example, arranged rotated through 45° with respect to one another with respect to the azimuth.

DE 10 2014 008 083 A1 discloses field generators for generating quadrupole fields. The arrangement serves for astigmatism compensation.

SUMMARY

The disclosure seeks to provide an improved option for the independent lens effects or focus settings for a multiplicity of individual particle beams in a multiple particle system. For example, the disclosure seeks to provide the independent lens effects or focus settings for the multiplicity of individual particle beams using a reduced voltage. The disclosure also seeks to provide the independent lens effects for the multiplicity of individual particle beams with increased effect and to provide a focus setting with a greater refractive power and shorter focal length.

The disclosure further seeks to provide an improved option for field curvature correction for a multiple particle beam system.

For independent focussing of a multiplicity of individual particle beams, for example for field curvature correction, the disclosure uses multi-pole sequences with at least two multi-pole arrays, which are individually controllable and which each generate specifically oriented quadrupole fields. In general, these quadrupole fields can include electric or magnetic quadrupole fields, or even of an electric-magnetic combination. However, in the case of a multiplicity of multi-poles in a small space within a multi-pole array, it is usually only electric multi-poles that can be implemented well from a technical point of view or only electric quadrupole fields that can be generated easily. Therefore, only electric multi-poles, multi-pole arrays or multi-pole fields are considered below. However, in general, all statements can also be transferred to a magnetic or electric-magnetic embodiment.

In general, the same particle-optical imaging as with an individual lens can be brought about by the above-described quadrupole fields. However, the realization according to the disclosure offers that, for the purposes of independently focussing a multiplicity of individual particle beams, for example for field curvature correction, work can be carried out at significantly lower voltages. A combination of the quadrupole fields with further multi-pole fields for further corrections within the scope of individual beam guidance or for the correction of further imaging aberrations is also possible in a simple manner.

According to a first aspect, the disclosure relates to a particle beam system comprising the following: a multiple beam particle source which is configured to generate a multiplicity of charged individual particle beams; a multi-pole lens sequence with at least one first multi-pole lens array and with at least one second multi-pole lens array, wherein the first multi-pole lens array comprises a multiplicity of individually adjustable first multi-pole lenses for generating first quadrupole fields and is arranged in the beam path of the particles in such a way that the individual particle beams substantially pass through the first multi-pole lens array and wherein the second multi-pole lens array comprises a multiplicity of individually adjustable second multi-pole lenses for generating second quadrupole fields and is arranged in the beam path of the particles so that the individual particle beams which pass through the first multi-pole lens array substantially also pass through the second multi-pole lens array; and a controller which is configured to control the multi-pole lenses of the multi-pole lens sequence in such a way that related groups of multi-pole lenses of the multi-pole lens sequence through which the same individual particle beam passes altogether overall exert an individually adjustable and focussing effect on the respective individual particle beam passing therethrough.

The charged particles can be for example electrons, positrons, muons or ions or other charged particles. The charged particles can be electrons generated, for example, using a thermal field emission source (TFE). However, other particle sources can also be used.

According to the disclosure, at least one particle source is provided, although a plurality of particle sources can also be provided. According to an embodiment of the disclosure, the multiple particle source can comprise the following in this case: at least one particle source, which is configured to generate a beam of charged particles; and a multi-aperture plate which has a multiplicity of openings, for example round openings, and which is arranged in the beam path of the particles in such a way that at least some of the particles pass through the openings of the multi-aperture plate in the form of the multiplicity of individual particle beams.

A concept of the disclosure is realized by the provision of the specific multi-pole lens sequence and the specific control thereof. A multi-pole is understood to mean a dipole, quadrupole, octupole or a higher-order multi-pole. Here, the multi-pole lens sequence comprises at least one first multi-pole lens array and at least one second multi-pole lens array. However, three, four, five, six or more multi-pole lens arrays may also be provided. In this case, the term sequence indicates that the multi-pole lens arrays are arranged in succession in the beam path of the individual particle beams, optionally directly in succession. However, other optical elements or components might also be situated between various multi-pole lens arrays of the multi-pole lens sequence. The desired focussing effect can be set by way of the controller with the aid of the sequence—and not necessarily with a single multi-pole lens array.

In general, the individual multi-pole lenses in the multi-pole lens arrays can have the same structure within the same array. It is also possible for the multi-pole lens sequence to comprise a plurality of multi-pole lens arrays with the same structure. In this case, the openings of the multi-pole lens array can be arranged in regular fashion in the array. By way of example, it is possible to arrange the multi-pole lenses in the array in a regular square or rectangle. However, the arrangement of the openings or multi-pole lenses in an array can be hexagonal. This means that the individual particle beams are arranged in accordance with a hexagonal structure for example with 61 or 91 individual particle beams (in accordance with the general formula $3n(n-1)+1$, where n is a natural number), and this arrangement is then geometrically also provided in the multi-pole lens array.

A multiplicity of individually adjustable first multi-pole lenses for generating first quadrupole fields is provided via the first multi-pole lens array. These quadrupole fields can be generated using quadrupole lenses. However, it is also possible for the generating multi-pole lens to be an octupole, for example, which is controlled accordingly. In this respect, consideration is given to aspect is not the structural configuration of the lens, but the generation of the quadrupole field with the aid of the lens. It is also possible for one or more other fields, for example multi-pole fields, to be superposed on each of the quadrupole fields.

The first multi-pole lens array and the second multi-pole lens array can be arranged directly in succession in the particle beam system. However, other multi-pole lens arrays or other optical components can also be arranged between the first multi-pole lens array and the second multi-pole lens array.

It is possible that the first multi-pole lens array and the second multi-pole lens array each have the same number of multi-pole lenses. However, the number could also differ. In an exemplary case, the individual particle beams pass through all multi-pole lenses in the first multi-pole lens array and all multi-pole lenses in the second multi-pole lens array. Here, multi-pole lenses of the multi-pole lens sequence, which belong to different multi-pole lens arrays, can be combined into groups. Here, a group is formed by the multi-pole lenses of different multi-pole lens arrays through which the same individual particle beam passes, respectively. Thus, the number of groups is identical in this case to the number of multi-pole lenses in each multi-pole lens array.

According to the disclosure, the controller is generally configured to control the multi-pole lenses of the multi-pole lens sequence in such a way that related groups of multi-pole lenses of the multi-pole lens sequence through which the same individual particle beam passes in each case altogether exert an individually adjustable and focussing effect on the respective individual particle beam passing therethrough. Thus, one individual particle beam can be individually influenced and focussed in each case with the aid of the group of multi-pole lenses. Focussing of an individual particle beam can be rendered possible by virtue of the individual particle beam passing through two differently oriented quadrupole fields. In general, it is known that a similar focussing effect can be obtained with the aid of two quadrupole fields as with a single lens or round lens. When focussing axially parallel particle beams, deviations from the optical axis Z are generally reduced. Here, quadrupole fields can influence particles or particle beams travelling or extending at different positions from the optical axis in different ways. Therefore, focussing can be carried out in a first direction only (e.g., only correcting an x-deviation from the axis or only correcting a y-deviation from the axis) when a single quadrupole field is used, the centre of which is located on the optical axis or which extends along the optical axis. However, if a second quadrupole field is now likewise arranged on the optical axis of the system in sequential fashion and with a different orientation in relation to the first quadrupole field, this can also implement focussing in a second direction that is orthogonal to the first direction.

According to an embodiment of the disclosure, the quadrupole of the first quadrupole field and/or the quadrupole of the second quadrupole field substantially have an orientation rotated through 90° with respect to one another and substantially have the same amplitude. In the case of a quadrupole, an orientation rotated through 90° corresponds to the inversion of the voltage configuration to the electrodes of the quadrupole.

According to an embodiment of the disclosure, the orientation between the two quadrupoles is rotated exactly through 90°, with exactly in this case meaning that orienting the quadrupoles is undertaken as accurately as possible. However, it is also possible that the rotation of the orientation is not exactly 90°, to be precise in the cases where this deviation from 90° may be desirable. By way of example, this is the case if the multi-pole lens sequence is preceded by a strong magnetic lens effect, for instance a condenser lens system. The magnetic field of this magnetic lens(es) then can still act into the multi-pole lens sequence and the individual particle beams experience a Larmor rotation in the magnetic field. The errors arising as a result thereof can be corrected by rotating the orientation of the quadrupoles of the first and second quadrupole field with respect to one another.

The use of sequentially arranged quadrupole fields in comparison with individual lenses or round lenses can involve a voltage at the electrodes of the multi-pole lenses for the focussing effect which can be chosen to be significantly lower than in the case where an individual lens or round lens is used. For an exemplary beam energy of 10 keV, a typical absolute value for the voltage for focussing is more than 1000 V, for example −1250 V. By contrast, if quadrupoles are used, the focussing voltage at the same beam energy is only approximately 50 V. This can be beneficial within the scope of supplying voltage to the multi-pole lenses.

According to an embodiment of the disclosure, the first multi-pole lens array and/or the second multi-pole lens array comprises a quadrupole lens array. Four electrostatic electrodes are therefore provided per multi-pole lens, the electrostatic electrodes can have an identical configuration. Since two electrodes, for example from a structural point of view, should respectively have exactly the same voltage in a quadrupole, it is possible, for example, to supply electrodes with the same polarity or voltage with the aid of the same voltage source. Thus, it is possible to respectively couple opposing electrodes with one another with respect to the voltage supply in order to generate a quadrupole field that is as clean as possible and has the smallest possible parasitic dipole field. When supplying opposing electrodes with separate voltage supplies, such parasitic dipole fields with varying or noisy amplitudes may arise on account of variations or noise in the individual voltage supplies. This idea of coupling electrodes of the same voltage also applies analogously to higher-order multi-poles.

According to an embodiment of the disclosure, the multi-pole lens sequence comprises a third multi-pole lens array, wherein the third multi-pole lens array comprises a multiplicity of individually adjustable third multi-pole lenses for generating third quadrupole fields and is arranged in the beam path of the particles between the first and the second multi-pole lens array so that the individual particle beams which pass through the first multi-pole lens array substantially also pass through the third multi-pole lens array, and wherein the controller is furthermore configured to control the multi-pole lenses of the multi-pole lens sequence, through which the same individual particle beam passes in each case, in such a way that these altogether exert such an effect on the respective individual particle beams passing therethrough that the imaging of the individual particle beams in a focal plane is substantially distortion-free. Thus, the imaging quality can be increased yet again with the aid of this embodiment. While the desired focussing is generally only achieved in distorted fashion if only two quadrupole fields are used (a circular input beam is converted into an elliptical output beam), distortion-free focussing can be achieved when using a total of three quadrupole fields (a circular input beam is converted into a circular output beam). When transferring an extended image field, the magnification, for example in the x-direction and y-direction, would be the same; however, only the particle source is imaged and so the observation of the image field is theoretical.

A further distinguishing criterion can be the behaviour of the multi-pole lenses when focussing through without changing the excitation of the multi-poles. By way of example, a particle beam incident in parallel is changed into a particle beam incident in slightly divergent fashion, for example by reducing the refractive power of a condenser lens system situated upstream thereof in the beam path of the particles. This generates a displacement of the focal plane away from the quadrupoles in both embodiments, i.e., in the case of multi-pole lens sequences with two or three multi-lens arrays or two or three quadrupole fields. However, an astigmatism arises in the new focal plane in the embodiment with two quadrupole fields while it is only a distortion that arises in the embodiment with three quadrupole fields.

With respect to the third multi-pole lens array and the construction thereof, what was already explained above with respect to the first multi-pole lens array and with respect to the second multi-pole lens array applies.

If, according to the disclosure, a first, second and third multi-pole lens array are used with correspondingly generated quadrupole fields for focussing the individual particle beams, provision can be made according to an embodiment of the disclosure for the quadrupoles of the first and the second multi-pole lens array to have substantially the same orientation and substantially the same amplitude and for the quadrupoles of the third multi-pole lens array to have an orientation that is rotated through approximately 90° with respect to the first and second quadrupoles, wherein the amplitude of the third quadrupole is greater than, for example approximately twice as large as, the respective amplitude of the first and the second quadrupole. Alternatively, the increased effect of the third quadrupole can also be achieved by doubling the length thereof in the axial direction while having an unchanged amplitude (or any combinations thereof). Thus, the control of the voltage supply of the multi-pole lens arrays is different in the case of three multi-pole lens arrays overall than in the case of only two multi-pole lens arrays. However, what also applies here is that the effect on the individual particle beams can be obtained by an appropriate voltage supply or control of multi-pole lenses of the same group, i.e., of those multi-pole lenses that are passed through by the same individual particle beam. The length of all multi-poles of the multi-pole sequence can be identical since this can be desirable from a manufacturing point of view. This can apply to both this and all other embodiments of the disclosure. Here, the length of the multi-poles (also referred to as the thickness of the multi-poles below) should be understood to mean the extent thereof in the direction of the multi-pole axis Z.

The multi-pole lens sequence comprises a fourth multi-pole lens array in accordance with an embodiment of the disclosure. In general, what was already explained above in relation to the first, second and third multi-pole lens array with respect to the structure also applies to this fourth multi-pole lens array. The fourth multi-pole lens array likewise comprises a multiplicity of individually adjustable fourth multi-pole lenses for the purposes of generating fourth quadrupole fields. Here, the fourth multi-pole lens array is arranged in the beam path of the particles between the first and the second multi-pole lens array so that the individual particle beams which pass through the first multi-pole lens array substantially also pass through the fourth multi-pole lens array. Furthermore, the controller is configured to control the multi-pole lenses of the multi-pole lens sequence—i.e., with the first, second, third and fourth multi-pole lens array in this case—in such a way that these altogether exert such an effect on the respective individual particle beams passing therethrough that the imaging of the individual particle beams is substantially astigmatism-free. Thus, the desired effect or desired imaging for each individual particle beam is also achieved here by the group of related multi-pole lenses, through which the same individual particle beam passes. Thus, the imaging quality can be further improved with the aid of the fourth multi-pole lens array or the fourth quadrupole field generated thereby. Like in the embodiment with three quadrupoles, the imaging is stigmatic and distortion-free. However, additionally there no longer is a distortion in the displaced focal plane during focussing through with a constant excitation of the quadrupoles. When four appropriately switched quadrupole fields are used, it is consequently no longer possible to distinguish the imaging achieved in the axis distances from the imaging by a round lens in the linear approximation.

If a multi-pole lens sequence with four multi-pole lens arrays is used for focussing, it can be the case that the quadrupoles of the first and the second multi-pole lens array have substantially an orientation rotated through 90° with respect to one another and substantially the same amplitude, and that the quadrupoles of the third and the fourth multi-pole lens array have substantially an orientation rotated through 90° with respect to one another and substantially the same amplitude, wherein the sequence of orientations of the quadrupoles is alternating and wherein the amplitudes of the third and the fourth quadrupole are respectively greater than, for example respectively approximately three times as large as, the amplitudes of the first and the second quadrupole. In the case of a beam energy of 10 keV, typical values are ±22 V for the outer quadrupoles and ±66 V for the inner quadrupoles. Alternatively, it is possible, for example, to increase the amplitude of the outer quadrupoles and shorten their length in the axial direction in order consequently to be able to use the same voltage supplies or at least voltage supplies with the same structure. Here, too, the focussing voltage involved overall is therefore significantly lower than the focussing voltage involved for a single lens. Further details with respect to involved voltages will still be explained in more detail below.

At least one multi-pole lens array comprises an octupole lens array in accordance with an embodiment of the disclosure. Here, this multi-pole lens array can also be the first, second, third and/or fourth multi-pole lens array as described above, or else a further multi-pole lens array. What is important here is that quadrupole fields can also be generated with the aid of an octupole lens array if the electrodes of the octupole lens are controlled accordingly. Moreover, two superposed quadrupoles or quadrupole fields can also be generated by way of an appropriate control if eight electrodes are present in an octupole lens. Therefore, the orientation of a quadrupole field or of an overall resultant quadrupole field can be varied with the aid of an octupole lens.

According to an embodiment of the disclosure, the controller is set up to control the octupole lenses in such a way that an electric field generated by the octupole electrodes yields a superposition of two quadrupole fields, wherein this superposition substantially results in a quadrupole field that is slightly rotated about the main axis of the individual particle beam with respect to one of the quadrupole fields, for example the stronger one of the quadrupole fields. In this case, too, electrodes of the octupole lens to which the same voltages should be applied can be supplied by way of a common voltage source in order to generate relatively stable fields.

According to an embodiment of the disclosure, the controller is configured to control the multi-pole lenses in such a way that an electric field generated by the multi-pole electrodes is a superposition of a quadrupole field and a dipole field. Here, the multi-pole lenses can be octupole lenses, for example. As already described, particles entering the quadrupole field in parallel fashion are deflected toward the axis or away from the axis. A particle beam centred about a particle trajectory entering the quadrupole field offset to the geometric axis of the multi-pole is likewise deflected. In the case of the right choice of the amplitude and orientation, a superposed dipole field can compensate this deflection, wherein this superposition with respect to the quadrupole field then results in a quadrupole field that is displaced from the geometric axis of the single multi-pole lens. The particle-optical axis of the quadrupole field and the geometric axis of the multi-pole lens thus no longer coincide.

If an additional dipole field is only generated in one quadrupole field, this yields a deflection in one direction in the case of a particle running centrally through a multi-pole lens. By contrast, if dipole fields are generated in addition to the quadrupole fields in two multi-pole lens arrays, a deflection at two points in two directions and hence, in the case of an anti-parallel orientation of the dipole fields with respect to one another (the precise orientation depends on the presence of external magnetic fields, e.g., on condenser lenses), a parallel offset of the individual particle beams overall when passing through the multi-lens can be achieved.

A superposition of quadrupole and dipole fields as described above is successful both in the case of a quadrupole lens and in the case of an octupole lens or multi-pole lenses with an even greater number of poles. Here, however, the octupole lens can be desirable over the quadrupole lens in that the quadrupole field involved according to the presented method can be both displaced and rotated electrically. This also applies to multi-pole lenses with an even greater number of poles, although the technical outlay becomes ever larger in the process.

According to an embodiment of the disclosure, all electrodes of an octupole lens of the octupole lens array have the same size and shape. This can allow for relatively simple manufacture of the octupole lens array.

However, alternatively it is also possible that at least some of the electrodes of an octupole lens of the octupole lens array have different sizes and/or different shapes. The shape and size of an electrode have an influence on the electric field generated by the electrode. By way of example, if the electrodes that generate a quadrupole field are large, the quadrupole field generated here dominates. By contrast, if the remaining electrodes arranged therebetween are small, the electric field generated thereby is weak as a result of the shadowing effect. Moreover, other electric field shapes can be generated in a targeted fashion when there is a deviation from a rounded shape of the electrodes, for example.

At least one multi-pole lens array comprises a dipole lens array in accordance with an embodiment of the disclosure. Here, these are true dipole lenses and not only a dipole field that has been generated by higher-order multi-pole lenses. This generally applies within this patent application. If reference is made to a specific multi-pole lens, this multi-pole lens also has the corresponding number of electrodes. By contrast, if reference is made to a field, this field can be produced by different types of multi-pole lenses, depending on how the electrodes of the multi-pole lenses are controlled.

According to an embodiment of the disclosure, the multi-pole lens sequence comprises multi-pole lens arrays for generating the following field sequence: a quadrupole field—at least two dipole fields with different orientations with respect to one another, for example two substantially antiparallel dipole fields—a quadrupole field. Using such an arrangement, individual particle beams can be offset parallel to the optical axis between the passage through the two quadrupole fields.

According to an alternative embodiment of the disclosure, the multi-pole lens sequence comprises multi-pole lens arrays for generating the following field sequence: a dipole field—a quadrupole field—a further quadrupole field—a further dipole field with a different orientation to, for example substantially antiparallel to, the first dipole field.

According to an embodiment of the disclosure, the multiple beam particle source comprises the following: at least one particle source, which is configured to generate a beam of charged particles; and a multi-aperture plate which has a multiplicity of openings and which is arranged in the beam path of the particles in such a way that at least some of the particles pass through the openings of the multi-aperture plate in the form of the multiplicity of individual particle beams. Thus, the individual particle beams are only generated in the first place by the multi-aperture plate. In general, the openings in the multi-aperture plate are round because this corresponds to the desired optimal beam diameter. However, according to another embodiment of the disclosure it is also possible for at least some of the openings, all openings apart from an opening optionally arranged centrally on the optical axis, in the multi-aperture plate can have an elliptical cross section. In the case of an appropriate choice of the size and orientation of the elliptical cross sections of the openings, it is possible to generate a subsequent asymmetry in the form of a distorted particle beam. If an individual particle beam passes through a central opening in the multi-aperture plate, it is expedient for this central opening to have not an elliptical but a round embodiment of the cross section. Overall, the ellipticity of the openings in the multi-aperture plate increases with increasing distance from the centre of the multi-aperture plate or the central round opening in the multi-aperture plate. Here, the orientation of the elliptical openings is as follows: If the connection between the centre of the ellipse and the centre of the multi-aperture plate is considered, the major axis of the ellipse passing through the centre is orthogonal or parallel to a ray passing radially from the centre of the multi-aperture plate through the centre of the ellipse. Expressed differently, the minor axis of the ellipse is oriented in the radial direction proceeding from the centre of the multi-aperture plate or oriented orthogonally to this direction. Typical opening diameters for openings in the multi-aperture plate are $d \leq 150$ μm, for example $d \leq 50$ μm and/or $d \leq 10$ μm.

According to an embodiment of the disclosure, the particle beam system furthermore comprises the following: a round lens array which comprises a multiplicity of focussing particle lenses and which is arranged in the beam path of the particles in such a way that the individual particle beams which pass through the multi-pole lens sequence substantially also pass through the round lens array, wherein the focussing particle lenses of the round lens array are not multi-pole lenses. Instead, this can be individual lenses, for example. The aforementioned round lens array is already used in many particle beam systems and, for example, in multi-beam particle microscopes. If this round lens array is now combined with the multi-pole lens sequence according to the disclosure, this allows field curvature in the existing systems to be corrected. Moreover, the focussing effect generated by the multi-pole lens arrays can be comparatively weak in this case since this arrangement serves only to correct the focal position and not to focus the individual particle beams on its own. However, this would equally be possible.

According to an embodiment of the disclosure, the round lens array is arranged downstream of the multi-pole lens sequence in the beam path of the particles and the system moreover comprises the following: a condenser lens system which is arranged upstream of the multi-pole lens sequence in the beam path of the particles. Overall, this results in the sequence of condenser lens system—multi-pole lens sequence—round lens array. The condenser lens system typically comprises one or more magnetic condenser lenses, the magnetic field of which still acts on the charged particles of the individual particle beams in the region of the multi-pole lens sequence. However, a Larmor rotation still present as a result thereof can be taken into account by appropriately oriented quadrupole fields in the multi-pole lens sequence—as already described above.

After the individual particle beams have been generated—after passing through the multi-aperture plate in this case which, incidentally, can also be combined with a multi-pole lens array or else the multi-lens array—the imaging aberrations already described and, for example, unwanted field curvature occur over the further course of the particle-optical beam path. According to the disclosure, it is now possible that the controller exerts an effect on the individual particle beams in such a way that the foci of the individual particle beams are located on a concave area. This concave arching of the area can be chosen in such a way that it exactly compensates the convex field curvature of all subsequent optical components in the imaging system. Thus, what can be achieved is that the individual particle beams are incident on a sample situated in the object plane in precise fashion and with a great depth of focus.

The aforementioned methods which achieve focussing similar to focussing with a round lens using an ensemble of quadrupole fields have the following in common: An astigmatism arises should a quadrupole field deviate from its envisaged strength. This can be used to correct a further image aberration of the imaging system: the astigmatism of oblique bundles. In the way in which the focus setting of an individual particle beam is set, and hence the defocus that varies over the image field (field curvature) is corrected, it is also possible to correct the astigmatism that varies over the image field (astigmatism of oblique bundles) by adapting the strength and orientation of an individual quadrupole field.

According to an embodiment of the disclosure, there is a coupled voltage supply for electrodes of a multi-pole lens to which the same voltage is to be applied. As a result of this coupled voltage supply, the dipole components of the electric fields that are generated by the multi-pole lenses are more stable than in the case of an individual voltage supply for the electrodes. Moreover, it may be easier to arrange the lines for supplying the electrodes since fewer lines need to be housed in a small space. Moreover, electrodes of multi-pole lenses that belong to different multi-pole lens arrays but can belong to the same group of multi-pole lenses are also supplied in coupled fashion by the same voltage source. This measure also firstly simplifies the production of the multi-pole lens sequence and secondly allows more precise field shapes and particle beams to be generated with deflection angles that have only little variation or noise.

According to an embodiment of the disclosure, voltages applied to the electrodes of the multi-pole lens sequence are each less than 100 V in the case of a beam energy of approximately 10 keV. Thus, the applied voltage is very low in comparison with the voltage applied in the case of individual lenses.

According to a second aspect of the disclosure, the latter relates to the use of an above-described particle beam system for field curvature correction. What can be achieved here by skillful control of the multi-pole lens sequence is that—as already explained in more detail above—the position of the foci of the individual particle beams comes to rest on a concave surface, wherein the curvature of this surface exactly compensates the field curvature (convex form) arising further downstream in the beam path. However, the particle beam system according to the disclosure can also be used for other purposes, for example within the scope of an individual beam current adjustment.

According to a third aspect of the disclosure, the latter relates to the use of the particle beam system for correcting the astigmatism of oblique bundles.

According to a fourth aspect of the disclosure, the latter relates to a multi-beam particle microscope with a particle beam system as described above. Here, too, there can be a field curvature correction in the multi-beam particle microscope via the particle beam system according to the disclosure.

According to a fifth aspect of the disclosure, the latter relates to a method for independently focussing a multiplicity of individual particle beams, for example for field curvature correction for a particle beam system as described above, the method including the following step: individually setting focal lengths for a plurality of individual particle beams, for example for all individual particle beams, via the multi-pole lens sequence. Here, the adjustment is also implemented in such a way that the foci of the individual particle beams, for example the foci of all individual particle beams, are located on a concave surface, the curvature of which corrects the field curvature subsequently occurring in the system. Here, the focal lengths can be set via the control of the particle beam system.

BRIEF DESCRIPTION OF THE DRAWINGS

The disclosure will be understood even better with reference to the accompanying figures. In the figures.

DETAILED DESCRIPTION

Figure 1:
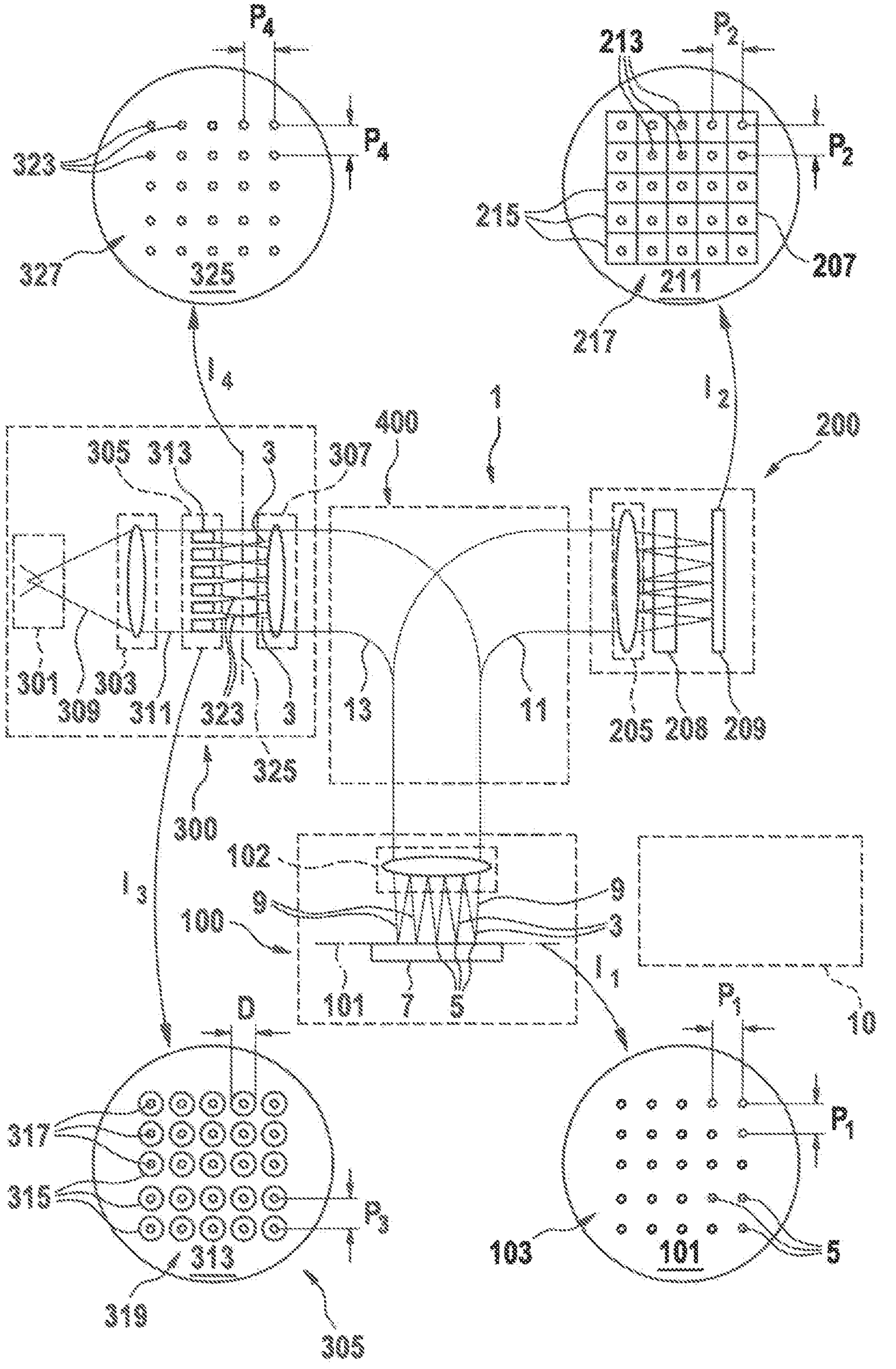
FIG. 1: shows a multi-beam particle microscope in a schematic illustration.

FIG. 1 is a schematic illustration of a particle beam system 1 in the form of a multi-beam particle microscope 1, which uses a multiplicity of particle beams. The particle beam system 1 generates a multiplicity of particle beams which impinge an object to be examined in order to generate there interaction products, e.g. secondary electrons, which emanate from the object and are subsequently detected. The particle beam system 1 is of the scanning electron microscope (SEM) type, which uses a plurality of primary particle beams 3 which are incident on a surface of the object 7 at a plurality of locations 5 and generate there a plurality of electron beam spots, or spots, that are spatially separated from one another. The object 7 to be examined can be of any desired type—e.g., a semiconductor wafer or a biological sample—and comprise an arrangement of miniaturized elements, a detailed, extended structure or the like. The surface of the object 7 is arranged in a first plane 101 (object plane) of an objective lens 102 of an objective lens system 100.

The enlarged excerpt $I_1$ in FIG. 1 shows a plan view of the object plane 101 having a regular rectangular field 103 of locations of incidence 5 formed in the first plane 101. In FIG. 1, the number of locations of incidence is 25, which form a 5×5 field 103. The number 25 of locations of incidence is a number chosen for reasons of simplified illustration. In general, the number of beams, and hence the number of locations of incidence, can be chosen to be greater, such as, for example, 7×7 or 10×10, or else significantly greater, such as, for example, 20×30, 100×100 and the like.

In the embodiment illustrated, the field 103 of locations of incidence 5 is a substantially regular rectangular field having a constant pitch $P_1$ between adjacent locations of incidence. Exemplary values of the pitch $P_1$ are 1 micrometre, 10 micrometres and 40 micrometres. However, it is also possible for the field 103 to have other symmetries, such as a hexagonal symmetry, for example.

A diameter of the beam spots shaped in the first plane 101 can be small. Exemplary values of the diameter are 1 nanometre, 5 nanometres, 10 nanometres, 100 nanometres and 200 nanometres. The focussing of the particle beams 3 for shaping the beam spots 5 is carried out by the objective lens system 100.

The primary particles impinging the object generate interaction products, e.g., secondary electrons, back-scattered electrons or primary particles that have experienced a reversal of movement for other reasons, which emanate from the surface of the object 7 or from the first plane 101. The interaction products emanating from the surface of the object 7 are shaped by the objective lens 102 to form secondary particle beams 9. The particle beam system 1 provides a particle beam path 11 for guiding the multiplicity of secondary particle beams 9 to a detector system 200. The detector system 200 comprises a particle-optical unit with a projection lens 205 for directing the secondary particle beams 9 at a particle multi-detector 209.

The excerpt $I_2$ in FIG. 1 shows a plan view of the plane 211, in which individual detection regions of the particle multi-detector 209 on which the secondary particle beams 9 are incident at the locations 213 are located. The locations of incidence 213 lie in a field 217 with a regular pitch $P_2$ with respect to one another. Exemplary values of the pitch $P_2$ are 10 micrometres, 100 micrometres and 200 micrometres.

The primary particle beams 3 are generated in a beam generating apparatus 300 comprising at least one particle source 301 (e.g., an electron source), at least one collimation lens 303, a multi-aperture arrangement 305 and a field lens 307. The particle source 301 generates a diverging particle beam 309, which is collimated or at least substantially collimated by the collimation lens 303 in order to shape a beam 311 which illuminates the multi-aperture arrangement 305.

The excerpt 13 in FIG. 1 shows a plan view of the multi-aperture arrangement 305. The multi-aperture arrangement 305 comprises a multi-aperture plate 313, which has a plurality of openings or apertures 315 formed therein. Midpoints 317 of the openings 315 are arranged in a field 319 that is imaged onto the field 103 formed by the beam spots 5 in the object plane 101. A pitch $P_3$ between the midpoints 317 of the apertures 315 can have exemplary values of 5 micrometres, 100 micrometres and 200 micrometres. The diameters D of the apertures 315 are smaller than the pitch $P_3$ between the midpoints of the apertures. Exemplary values of the diameters D are $0.2 \times P_3$, $0.4 \times P_3$ and $0.8 \times P_3$.

Particles of the illuminating particle beam 311 pass through the apertures 315 and form particle beams 3. Particles of the illuminating beam 311 which impinge the plate 313 are absorbed by the latter and do not contribute to the formation of the particle beams 3.

On account of an applied electrostatic field, the multi-aperture arrangement 305 focuses each of the particle beams 3 in such a way that beam foci 323 are formed in a plane 325. Alternatively, the beam foci 323 can be virtual. A diameter of the beam foci 323 can be, for example, 10 nanometres, 100 nanometres and 1 micrometre. The multi-aperture arrangement 305 can now be supplemented with the multi-pole lens sequence according to the disclosure—as explained in more detail below.

The field lens 307 and the objective lens 102 provide a first imaging particle-optical unit for imaging the plane 325, in which the beam foci 323 are formed, onto the first plane 101 such that a field 103 of locations of incidence 5 or beam spots arises there. Should a surface of the object 7 be arranged in the first plane, the beam spots are correspondingly formed on the object surface.

The objective lens 102 and the projection lens arrangement 205 provide a second imaging particle-optical unit for imaging the first plane 101 onto the detection plane 211. The objective lens 102 is thus a lens which is part of both the first and the second particle-optical unit, while the field lens 307 belongs only to the first particle-optical unit and the projection lens 205 belongs only to the second particle-optical unit.

A beam switch 400 is arranged in the beam path of the first particle-optical unit between the multi-aperture arrangement 305 and the objective lens system 100. The beam switch 400 is also part of the second optical unit in the beam path between the objective lens system 100 and the detector system 200.

Further information relating to such multiple beam particle beam systems and components used therein, such as, for instance, particle sources, multi-aperture plate and lenses, can be obtained from the international patent applications WO 2005/024 881 A2, WO 2007/028 595 A2, WO 2007/028 596 A2, WO 2011/124 352 A1 and WO 2007/060 017 A2 and the German patent applications having the application numbers DE 10 2013 026 113 A1 and DE 10 2013 014 976 A1, the disclosure of which in the full scope thereof is incorporated by reference in the present application.

The multiple particle beam system furthermore comprises a computer system 10 configured both for controlling the individual particle optical components of the multiple particle beam system and for evaluating and analysing the signals obtained by the multi-detector 209. In this case, the control can also comprise the control of the multi-pole lens sequence according to the disclosure. In this case, the computer system 10 can be constructed from a plurality of individual computers or components.

Figure 2:
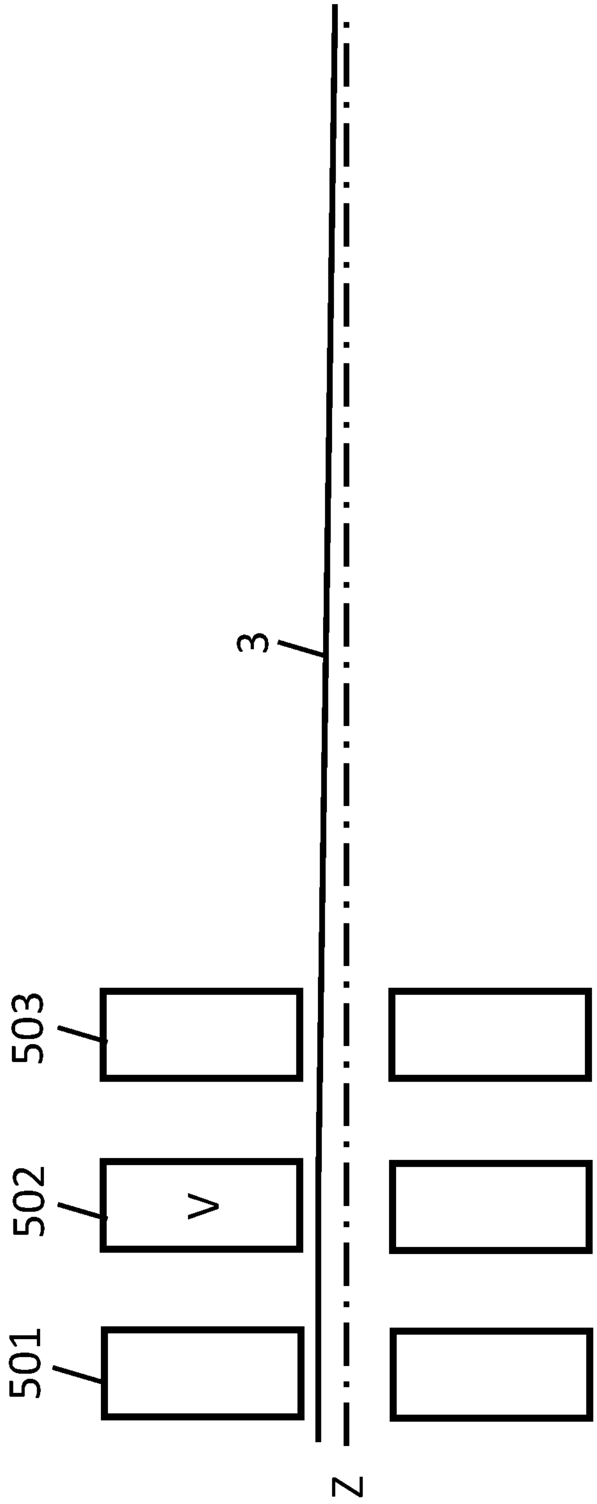
FIG. 2: schematically illustrates the (weak) focussing of a charged particle beam by a round lens or Einzel lens.

FIG. 2 schematically illustrates the (weak) focussing of a charged particle beam by a round lens or Einzel lens. This should aid the better understanding of the disclosure to be subsequently described. FIG. 2 illustrates an Einzel lens consisting of three plates 501, 502 and 503 which, in the present case, each have an opening with a round cross section and an exemplary diameter of 0.3 mm. In this case, the plates each have an exemplary thickness of 0.5 mm and are spaced apart by approximately 1 mm (measured centre to centre). In this case, the optical axis Z of the particle beam system extends centrally through the openings of the plates 501, 502 and 503. Here, the plates 501 and 503 are at the same potential. In relation to this potential, the plate 502 is at a negative potential of −1250 V. Furthermore, a beam energy of 10 keV is taken as a basis. FIG. 2 now illustrates a charged particle beam 3, for example an electron beam, that enters the arrangement parallel to the axis. The latter is focussed in the direction of the optical axis Z when passing through the Einzel lens consisting of the plates 501, 502 and 503. The point of intersection with the optical axis is not illustrated in FIG. 2; with the chosen parameters of the example, it is situated at a distance of approximately 100 mm from the central electrode 502. Generally, halving the focussing voltage V results in a focal length four times longer. In terms of absolute value, the focussing voltage, at −1250 V, is of the order of approximately 1 kV. In the case of an arrangement of such round lenses in an array with a pitch of 1 mm or less, it is technically difficult to guide the individual lines in this tight space from the many centre electrodes to the voltage supply in sufficiently well insulated fashion. However, the focal length of the individual particle beam 3 can be set individually in general by varying the focussing voltage.

Figure 3:
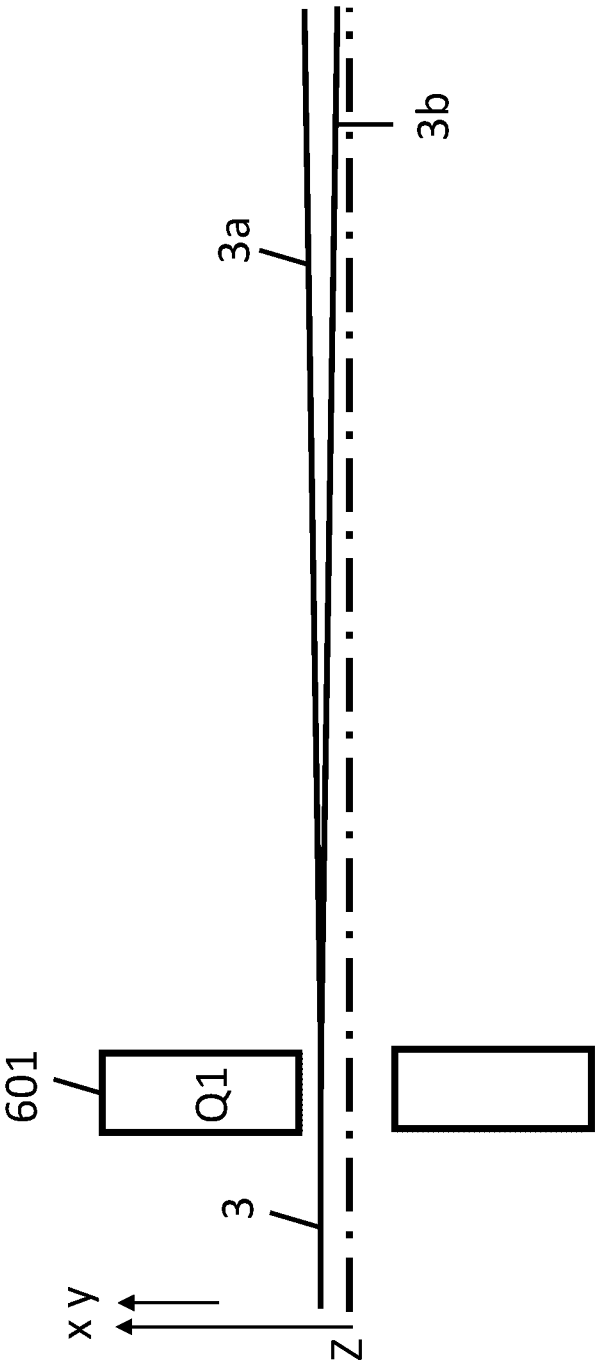
FIG. 3: schematically illustrates the deflection of a charged particle beam by a quadrupole field.

In contrast, FIG. 3 now schematically illustrates the deflection of a charged particle beam 3 through a quadrupole field Q1, which is a constituent part of a first multi-pole lens array 601. In this case, the optical axis Z extends centrally through the quadrupole field Q1. Now, a charged particle beam 3 that extends parallel to the axis and through the quadrupole field Q1 is plotted. The quadrupole lens generating the quadrupole field likewise has—for a better comparability with the individual lens of FIG. 2—an opening or round bore with a diameter of 0.3 mm and a thickness (extending in the Z-direction) of approximately 0.5 mm. The charged particle beam, an electron beam in this example, which passes through the quadrupole field Q1 parallel to the optical axis is now once again focussed at a distance of approximately 100 mm from the quadrupole Q1. This focussing is implemented with the aid of the quadrupole field Q1, albeit now only in one direction (split in directions x and y in the drawing, which are both projected onto the same axis direction in the plane of the drawing). Therefore, following the passage through the quadrupole Q1, the charged particle beam 3*a*, which is defocussed or virtually focussed in the y-direction, is illustrated separately from the charged particle beam 3*b*, which is focussed in the x-direction, in schematic fashion in FIG. 3. If once again a beam energy of 10 keV is taken as a basis, the focussing voltage for focussing in one direction is now only ±4.5 V, however. If the focussing voltage is halved, this only results in a focal length twice as long.

Figure 4:
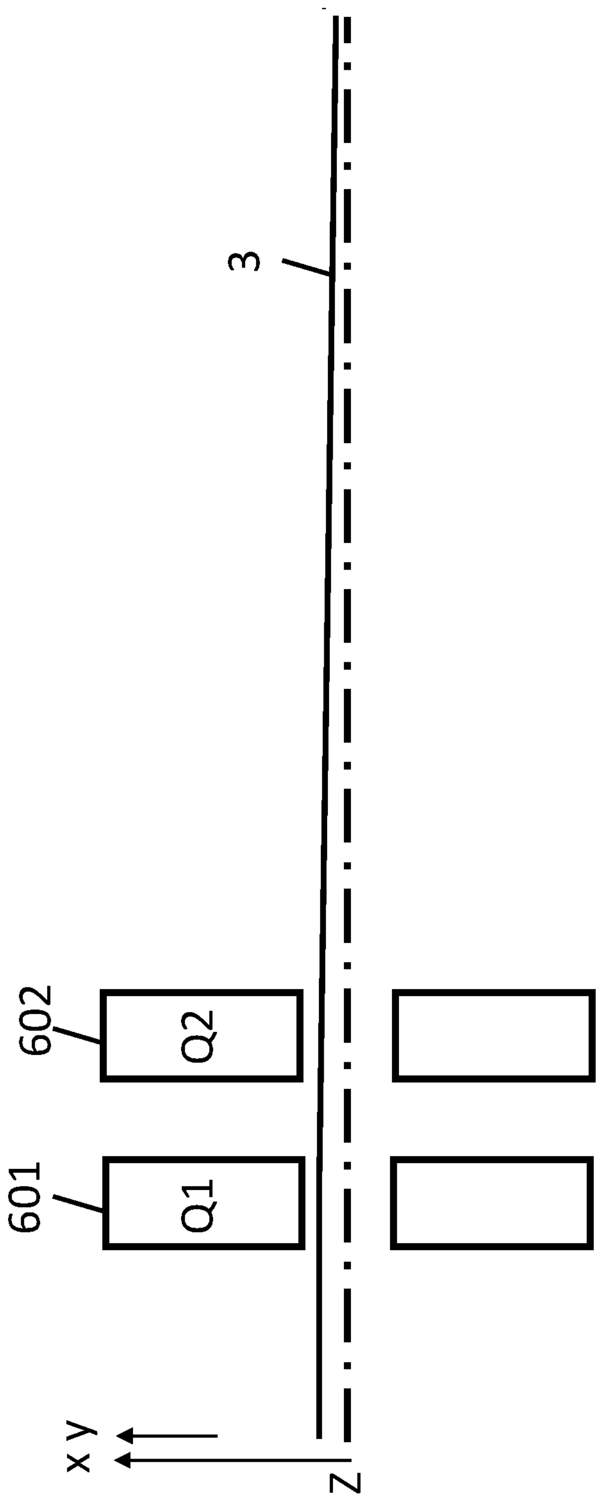
FIG. 4: schematically illustrates the deflection of a charged particle beam by two quadrupole fields.

FIG. 4 schematically illustrates the deflection of a charged particle beam 3 by two quadrupole fields Q1 and Q2. The quadrupole fields Q1 and Q2 are respectively generated with the aid of a first multi-pole lens array 601 and a second multi-pole lens array 602, with only an excerpt thereof being illustrated in FIG. 4. Only the particle beam profile for a single individual particle beam 3 is illustrated. In the present example, the two quadrupoles Q1 and Q2 have an identical structure, have openings with a diameter of 0.3 mm in each case and are spaced apart from one another (measured centre to centre) by 1 mm, and the multi-pole lenses that generate the quadrupole fields Q1 and Q2 each have plates with a plate thickness of 0.5 mm. In the example shown, the quadrupole Q1 of the first quadrupole field and the quadrupole Q2 of the second quadrupole field have an orientation substantially rotated through 90° with respect to one another and substantially have the same amplitude. In the example shown, a focussing voltage of ±50 V is used to obtain focussing of a 10 keV particle beam at a distance of 100 mm from the centre of the first quadrupole Q1. Here, halving the focussing voltage results in a four times longer focal length. Thus, charged particle beams passing through the quadrupole sequence in a manner parallel to the axis are focussed in the x-direction and in the y-direction by this arrangement.

Figure 5:
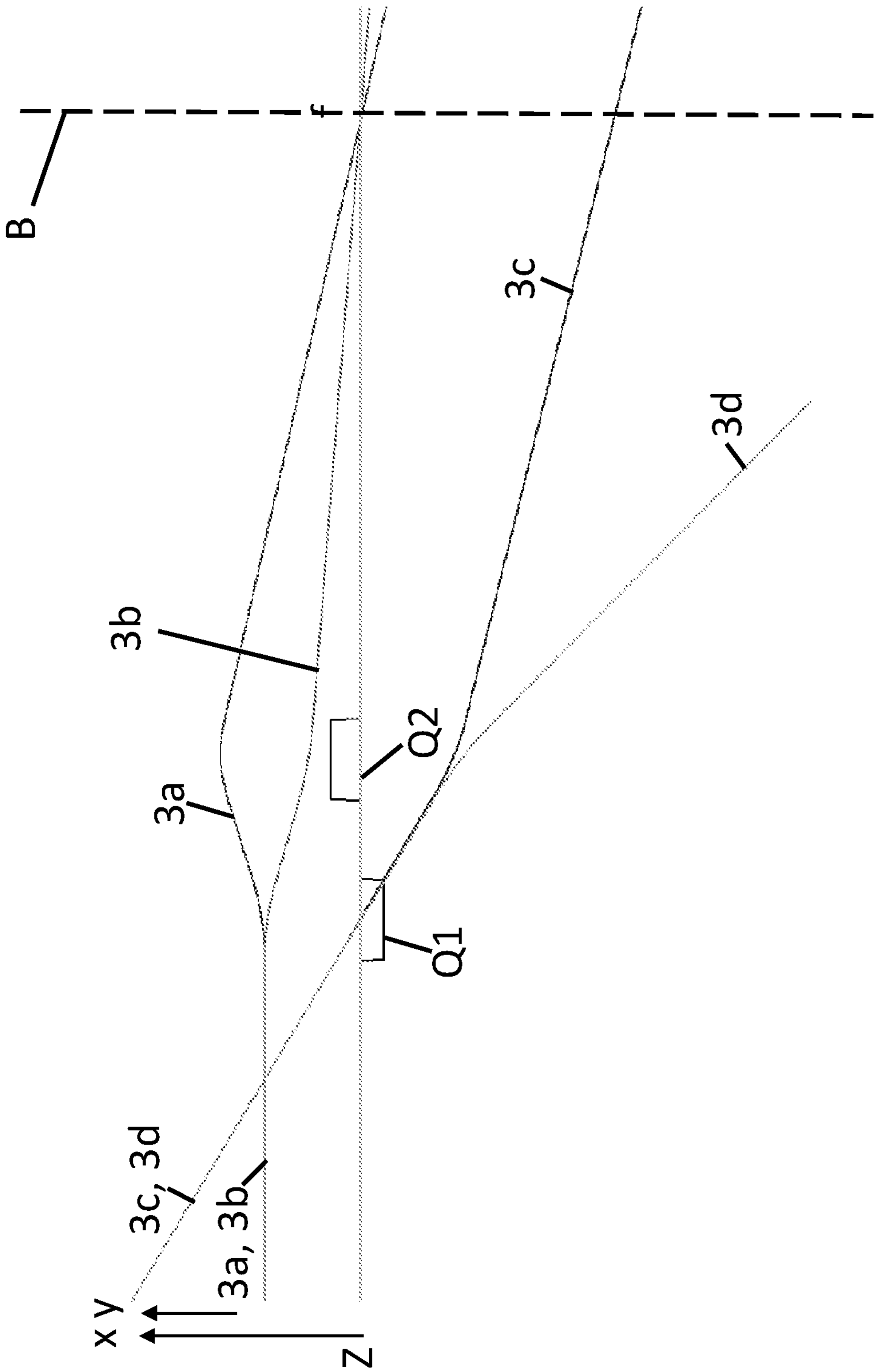
FIG. 5: schematically shows a detailed beam path belonging to the illustration of FIG. 4.

FIG. 5 schematically shows a detailed beam path belonging to the illustration of FIG. 4. Quadrupoles Q1 and Q2 are located along the optical axis Z. Plotted here is a beam with the components 3*a* and 3*b* which enters substantially parallel to the optical axis, the components being intended to indicate deviations in the x and y directions. When passing through the quadrupole field Q1, the particle beam 3*a* is initially defocussed and the component of the particle beam 3*b* is focussed. The conditions are reversed when passing through the quadrupole field Q2: The particle beam 3*a* is now focussed and the particle beam 3*b* is defocussed. However, on account of the great distance of the particle beam 3*a* from the axis, the particle beam is focussed more strongly in the process than what it was previously defocussed; a corresponding or opposite statement applies to the particle beam 3*b*, and so both particle beams 3*a* and 3*b* are focussed overall and meet at the focus f on the optical axis Z. Particle beams 3*c*, 3*d* incident obliquely with respect to the optical axis are likewise deflected in different ways when passing through the quadrupole fields Q1 and Q2. In the plane perpendicular to the optical axis Z through the focus f, the particle beams have different distances from the axis, which is why the imaging with the aid of the two quadrupole fields Q1 and Q2 yields a distorted image overall. The imaging generated with the aid of the two quadrupole fields Q1 and Q2 thus allows focussing of beams 3*a*, 3*b* that are parallel to the axis; however, these extend into the focus fat different angles on account of the distortion. As long as this imaging aberration is accepted, it is nevertheless possible to individually set the focal length for each individual particle beam 3. If a round particle beam is cut out with a circular opening in the multi-aperture plate 313 upstream of the quadrupole fields Q1 and Q2, an elliptical, divergent particle beam is obtained downstream of the focus f By contrast, if an elliptical particle beam is cut out with an elliptical opening in the multi-aperture plate 313 upstream of the quadrupole fields Q1 and Q2, a round, divergent particle beam is obtained downstream of the focus f provided the eccentricity of the elliptical opening was suitably chosen. Such a round, divergent particle beam is better suited to being focussed onto a very small spot 5 on the sample 7 by a downstream objective lens system 100 than the aforementioned elliptical, divergent particle beam.

Figure 6:
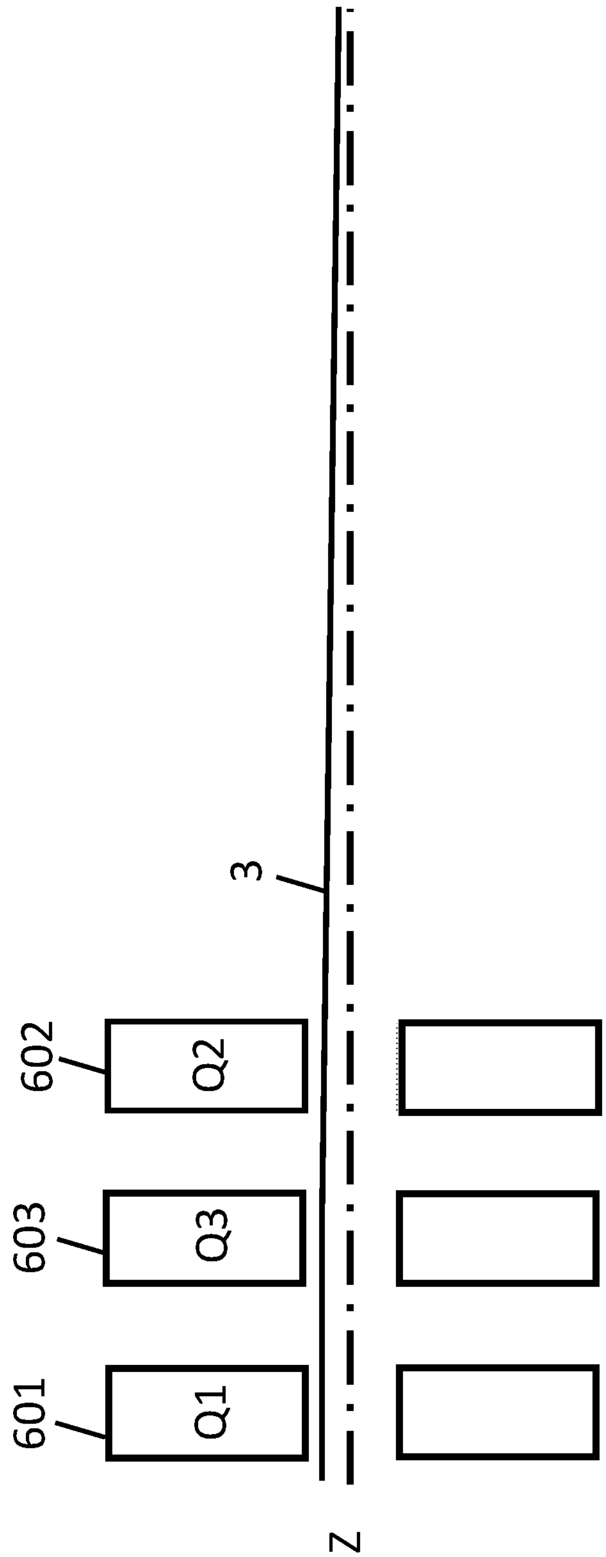
FIG. 6: schematically illustrates the deflection of a charged particle beam by three quadrupole fields.

FIG. 6 schematically illustrates the deflection of a charged particle beam 3 by three quadrupole fields Q1, Q3 and Q2, which are generated with the aid of a first multi-pole lens array 601, a second multi-pole lens array 602 and with the aid of a third multi-pole lens array 603. Here, the third multi-pole lens array 603 is arranged between the first multi-pole lens array 601 and the second multi-pole lens array 602. The multi-pole lens arrays 601, 602 and 603 are once again only shown in excerpts for a single individual particle beam 3. The exemplary illustration has once again been chosen for the best comparability with the embodiment in FIGS. 3 to 5: Once again, the three quadrupoles Q1, Q2 and Q3 have an opening with a respective diameter of 0.3 mm, the plate thickness is 0.5 mm again and the respective distance between the individual plates or the multi-pole lens arrays 601, 603 and 602 is 1 mm in each case, measured centre to centre. To once again achieve focussing at 100 mm distance from the centre of the central quadrupole Q3, a focussing voltage of ±74 V is applied to the inner quadrupole Q3 and a voltage of ±37 V is applied to the two outer quadrupoles Q1 and Q2 in the case of a beam energy of 10 keV. Thus, in terms of absolute value, the inner quadrupole is supplied with a voltage approximately twice the size in comparison with the outer quadrupoles. Here, the polarity of the quadrupoles Q1, Q3 and Q2 alternates.

Figure 7:
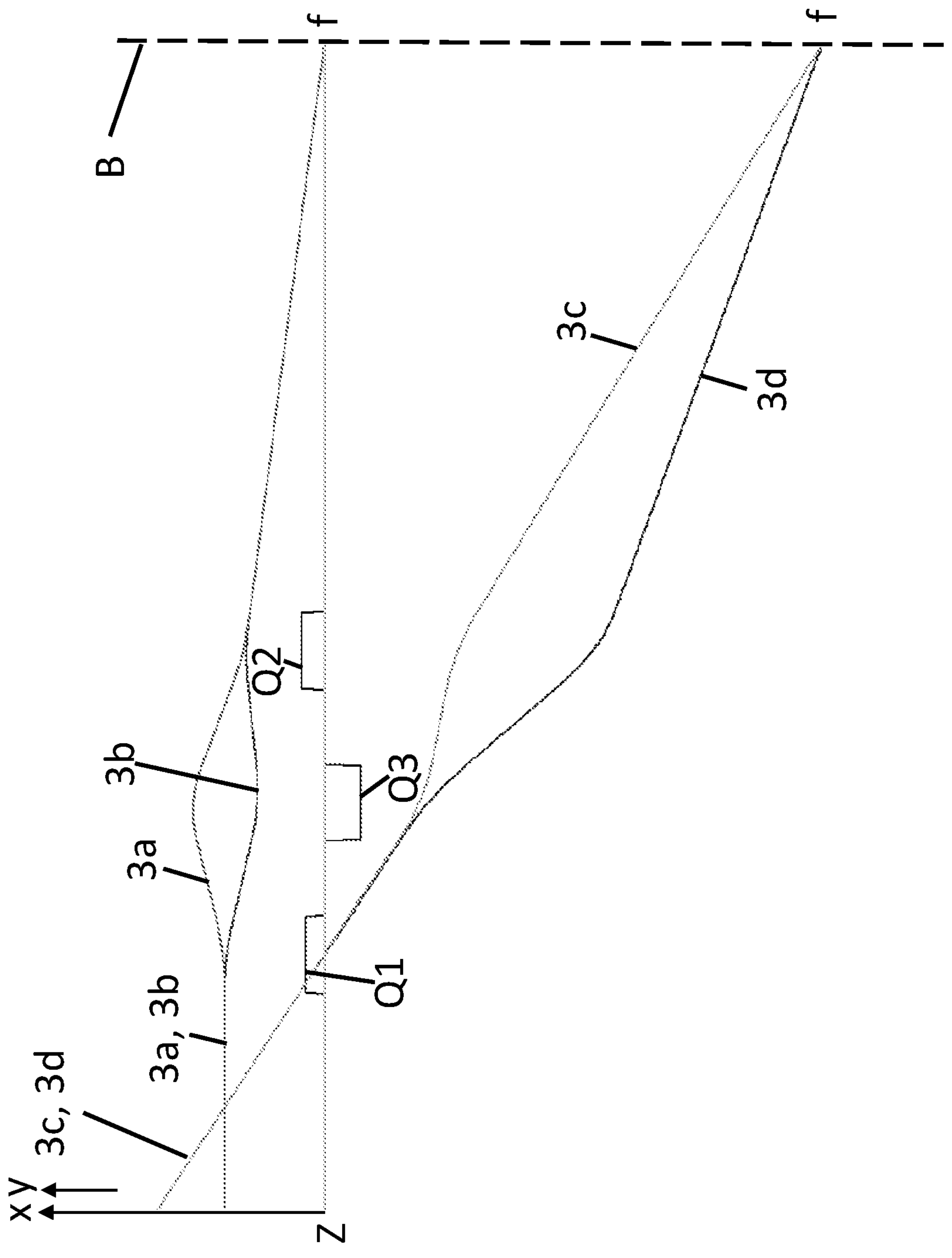
FIG. 7: schematically shows a detailed beam path belonging to the illustration of FIG. 6.

FIG. 7 schematically shows a detailed beam path belonging to the illustration of FIG. 6. Here, the improved imaging quality—in comparison with the illustration of FIG. 5 and only a sequence of two quadrupole fields—of the described use of three quadrupole fields is evident: The particle beams 3*a*, 3*b* that are parallel to the axis are once again focussed with respect to their deviations in the x- and y-direction when passing through the quadrupole sequence with the quadrupole fields Q1, Q3 and Q2 and intersect the optical axis Z at the focus f. Particle beams 3*c*, 3*d* incident obliquely to the optical axis are likewise deflected when passing through the quadrupole sequence Q1-Q3-Q2 and cross at the position of the intermediate image B, and so the image obtained thus is free from distortion. Thus, it is possible to obtain distortion-free imaging, at least at the position of an intermediate image B, with the aid of the multi-pole lens sequence with three quadrupole fields. There is no need for an elliptical opening in a multi-aperture plate possibly situated upstream of the quadrupole fields Q1, Q2 and Q3 in order to obtain a round, divergent beam downstream of the focus f; instead, a circular opening is sufficient.

Figure 8:
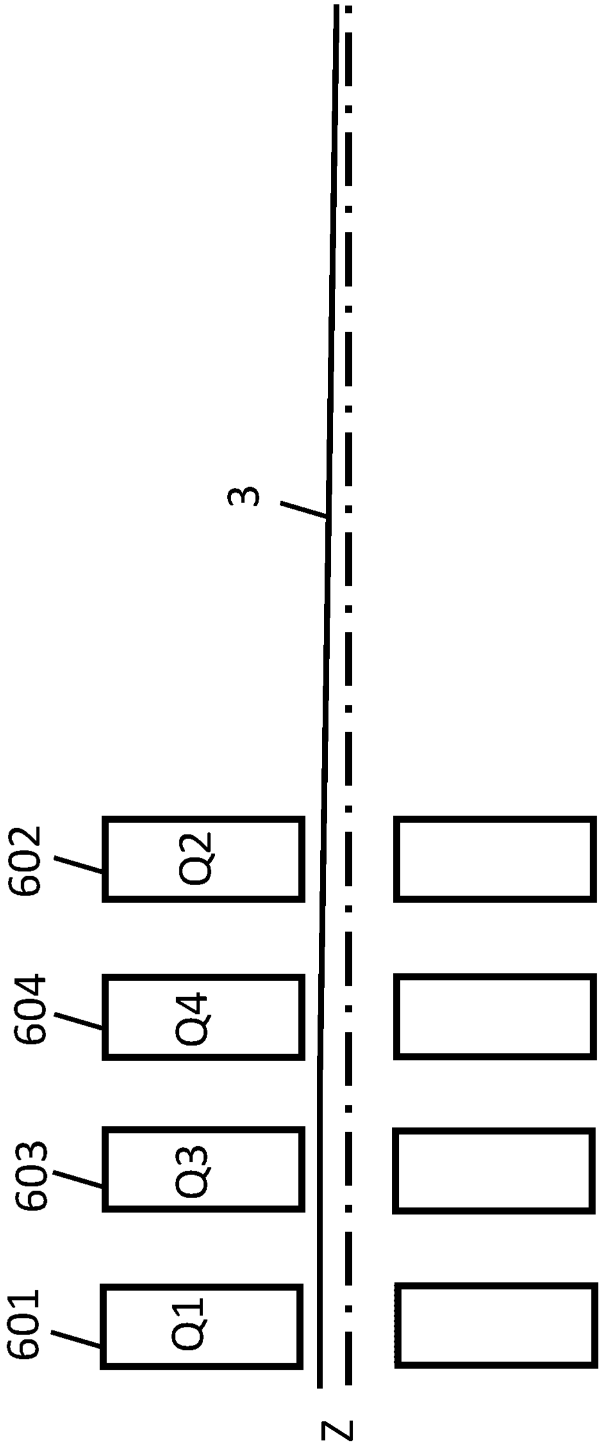
FIG. 8: schematically illustrates the deflection of a charged particle beam by four quadrupole fields.

FIG. 8 schematically illustrates the deflection of a charged particle beam by four quadrupole fields Q1 to Q4. For the purposes of an appropriate comparability, the respective quadrupoles Q1 to Q4 once again have an opening diameter of 0.3 mm and the associated plates have a thickness of 0.5 mm and are at a distance of 1 mm from one another in each case (measured centre to centre). A particle beam incident parallel to the axis is focussed at a distance of 100 mm from the centre of the quadrupole Q4. Here, the polarity of the quadrupoles Q1, Q3, Q4 and Q2 is provided in alternating fashion, wherein quadrupoles Q1 and Q2 have approximately the same voltage (amplitude) applied in terms of absolute value and quadrupoles Q3 and Q4 in turn have approximately the same voltage (amplitude) applied in terms of absolute value. The focussing voltage of the inner quadrupoles Q3 and Q4 is ±66 V in the selected example and the focussing voltage at the outer quadrupoles Q1 and Q2 is ±22 V in the case of a beam energy of 10 keV. Here, too, halving the focussing voltage results in a focal length four times as long.

Figure 9:
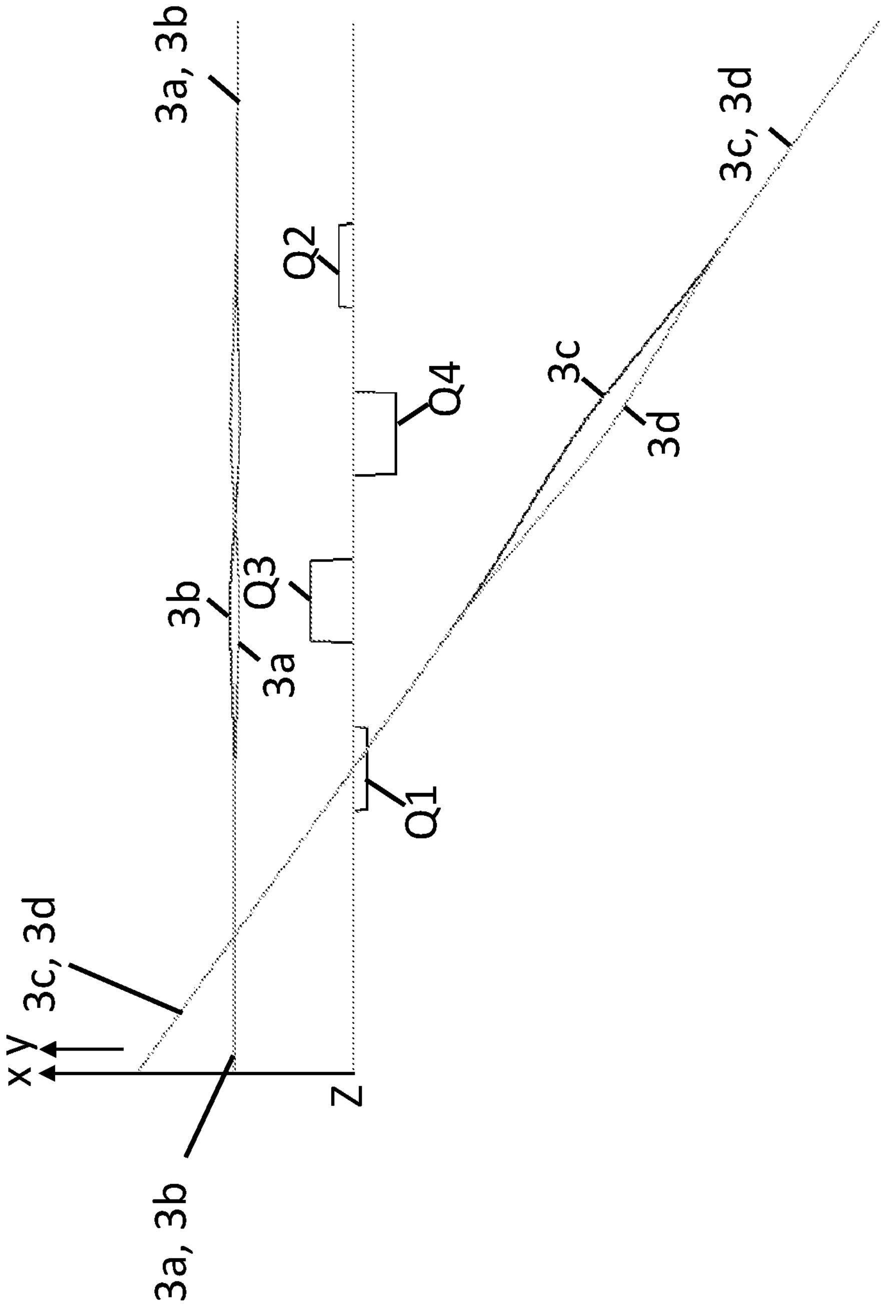
FIG. 9: schematically shows a detailed beam path belonging to the illustration of FIG. 8.

FIG. 9 now schematically shows the detailed beam path belonging to the illustration of FIG. 8. Particle beams 3*a*, 3*b* incident parallel to the axis are focussed at the same point under the same angle (i.e., they are congruent) and even beams 3*c* and 3*d* incident obliquely to the direction of the axis are congruent after passing through the sequence of the four quadrupoles Q1 to Q4. Thus, each individual particle beam can be focussed through with the aid of the multi-pole lens sequence shown and without adapting the control of the group of multi-pole lenses; i.e., it is possible to change from axis-parallel to convergent or divergent incoming radiation at the multi-pole lens sequence, for example by changing the excitation of the condenser lens system 303, and displace the relative position of the intermediate image B and the focus fin the process without the imaging generated thereby developing a distortion or an astigmatism.

Since the options for imaging with the aid of quadrupole fields have now been described above on the basis of various quadrupole sequences or excerpts of multi-pole lens sequences, the structural setup of a multi-pole lens sequence 600 and its arrangement in a multi-beam particle beam system and, for example, in a multi-beam particle microscope for the purposes of independently focussing a multiplicity of individual particle beams, for example for field curvature correction, is described below.

Figure 10:
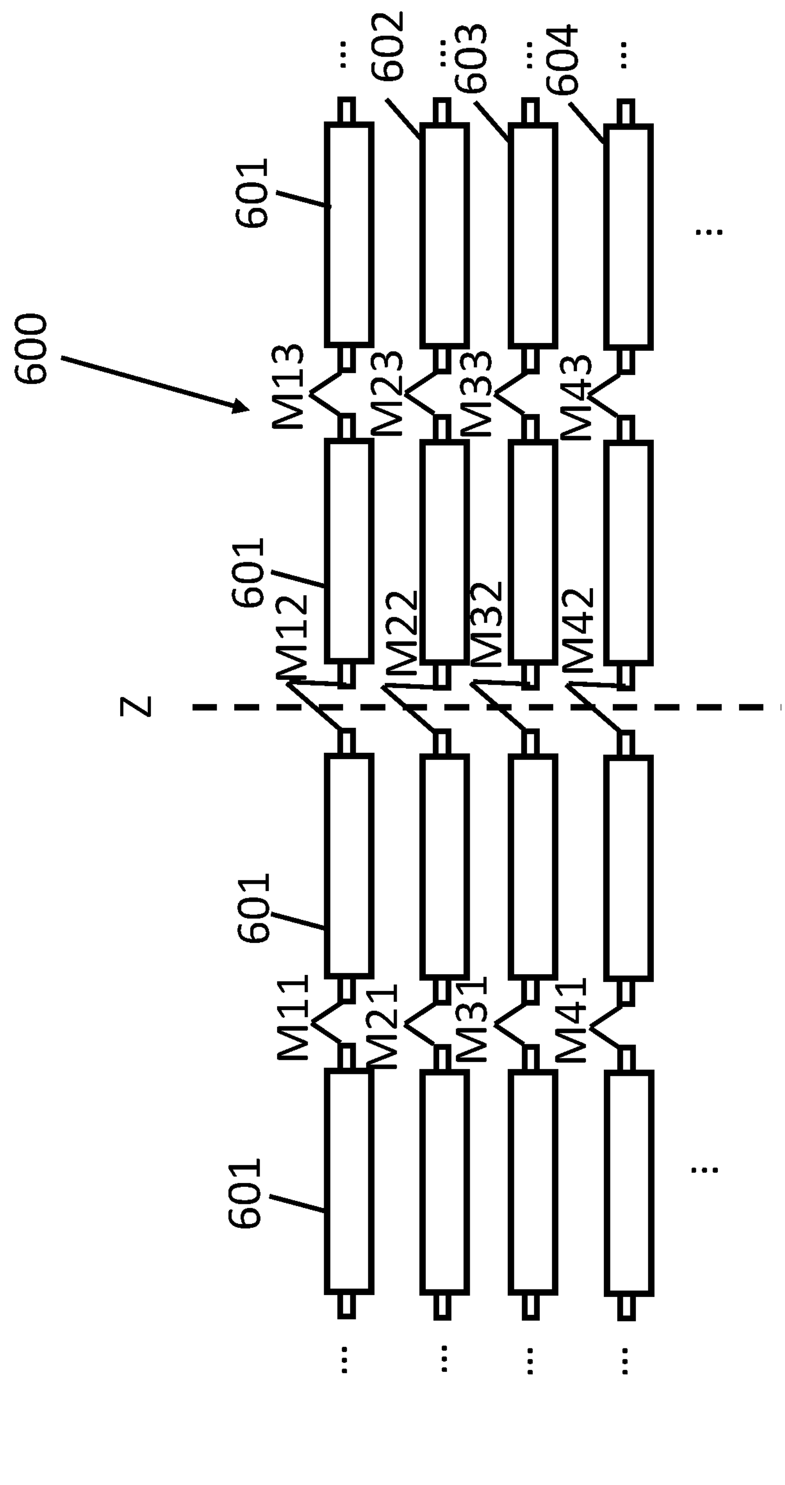
FIG. 10: schematically shows a structure of a multi-pole lens sequence.

FIG. 10 schematically shows a structure of a multi-pole lens sequence 600. Here, the multi-pole lens sequence 600 comprises a first multi-pole lens array 601, a second multi-pole lens array 602, a third multi-pole lens array 603 and a fourth multi-pole lens array 604. It is possible that a fifth, sixth, seventh or further multi-pole lens array is also a constituent part of the multi-pole lens sequence 600. In the illustrated case, the multi-pole lens arrays 601, 602, 603 and 604 each comprise a plate with openings arranged therein, in which the multi-pole lenses M1*i*, M2*i*, M3*i*, M4*i* are arranged. Here, the first multi-pole lens array comprises the multi-pole lenses M11, M12 and M13, which are illustrated in exemplary fashion. FIG. 10 shows a section through the multi-pole lens sequence 600, and so only some multi-pole lenses are illustrated in exemplary fashion. However, it is possible, for example, for the multi-pole lenses M1*i*, M2*i*, M3*i*, M4*i*, Mki to be arranged in a regular square or rectangle. However, the arrangement of the openings or multi-pole lenses in an array can be hexagonal. This means that the individual particle beams 3 are arranged in accordance with a hexagonal structure for example with 61 or 91 individual particle beams (in accordance with the general formula 3n(n−1)+1, where n is a natural number), and this arrangement is then geometrically also provided in each multi-pole lens array 601, 602, 603, 604. The first, second, third, fourth and/or further multi-pole lens array 601, 602, 603, 604 can have an identical structure. However, it is also possible for the multi-pole lens arrays 601, 602, 603, 604 to not have the same structure or only partly have the same structure. By way of example, this can relate to the thickness of the plates forming the array 601, 602, 603, 604 (and hence to the length of the multi-poles in the direction of the axis Z) but this may also apply to the configuration of the multi-pole lenses M1*i*, M2*i*, M3*i* and M4*i*. In addition or as an alternative thereto, the distances of multi-poles in a sequence can be the same from one another (measured centre to centre) but they can also vary. According to the disclosure, at least two of the illustrated multi-pole lens arrays generate quadrupole fields. In this case, it is possible in the case of an appropriate orientation and strength of the fields to generate a focussing effect similar to that of an Einzel lens or round lens for beams incident basically parallel to the axis, i.e., from slightly divergent beams to slightly convergent beams. Further multi-pole lenses can be used to correct further image aberrations. In this context, slightly convergent or else slightly divergent means that the virtual source position of the incident particle beam is further away from the multi-poles than the focus fin terms of absolute value; as a result, the multi-pole lens sequence requires neither negative refractive powers nor too high positive refractive powers. A negative refractive power could only be realized with difficulty and would, just like a high positive refractive power, also be accompanied by high voltage values at the multi-pole electrodes.

Figure 11:
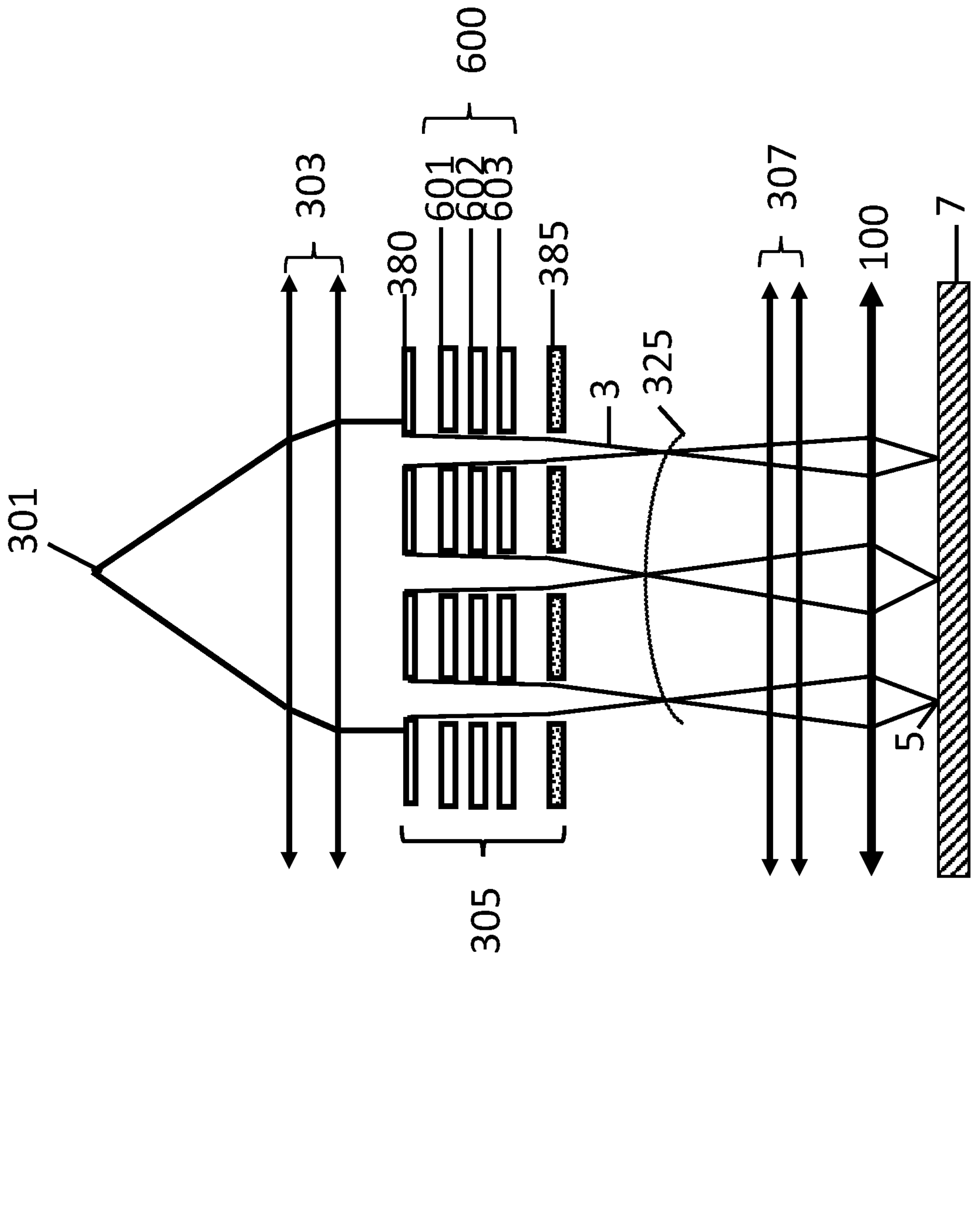
FIG. 11: schematically shows an arrangement of a multi-pole lens sequence in a multi-beam particle microscope for field curvature correction.

FIG. 11 now schematically shows an arrangement of a multi-pole lens sequence 600 in a multi-beam particle microscope 1 for field curvature correction. Here, the multi-beam particle microscope 1 is only illustrated in excerpts; the entire detection region and the beam switch are not illustrated in FIG. 11. Moreover, the illustrated beam path has been simplified; by way of example, the conventional crossover of all individual particle beams 3 with one another has not been illustrated so as to have a better overview.

The multi-beam particle microscope as per FIG. 11 comprises a particle source 301, which is a thermal field emission (TFE) source, for example. Electron beams 3 are generated in the illustrated example. The divergent particle beam is collimated with the aid of a collimation lens system or condenser lens system 303. Then, particle beams extending substantially parallel to the optical axis O (the optical axis O has not been illustrated so as to have a better overview; the optical axis O can but need not coincide with the axis Z of the multi-pole lens sequence) impinge a multi-aperture plate 380, which should be considered the start point for the individual particle beams 3. The individual particle beams 3 generated thus thereupon encounter the multi-pole lens sequence 600 which comprises a first, second and third multi-pole lens array 601, 602 and 603 in the illustrated example. However, it would also be possible for only two multi-pole lens arrays or else more than three, for example four, five, six or more, multi-pole lens arrays to be present. However, according to the disclosure, at least two of the illustrated multi-pole lens arrays generate quadrupole fields. This allows particle beams that are basically parallel to the axis to be focussed overall. After passing through the multi-pole lens sequence 600, the individual particle beams 3 pass through a round lens array 385. This multi-lens array does not comprise multi-pole lenses in this case, but instead comprises immersion lenses which arise on account of an electric field applied, for example together, to the termination plate of the round lens array 385 and which represent focussing particle lenses. The focussing power of the immersion lenses of the round lens array 385 is normally stronger than the focussing power of the multi-pole lens sequence 600. However, this is also reasonable if the multi-pole lens sequence 600 only serves to correct the focal lengths in order to facilitate a field curvature correction: After passing through the round lens array 385, the individual particle beams 3 are focussed on a plane 325 having concave curvature, the latter being chosen in such a way that field curvature generated upon incidence on the sample 7 by the subsequent particle-optical imaging is just corrected. After passing through a field lens system 307 and passing through an objective lens system 100, the charged particle beams 3 are incident on the sample 7 at the locations of incidence 5 in planar fashion without field curvature.

As an alternative to the position between the multi-aperture plate 380 and round lens array 385, the multi-pole lens sequence 600 can also be positioned upstream of the multi-aperture plate 380. This would yield an incident elliptical particle beam selected automatically when using only two multi-pole lens arrays 601 and 602 together with circular openings in the multi-aperture plate 380, the incident elliptical particle beam having the eccentricity in order to also generate round, divergent particle beams 3 downstream of the foci f. However, the multi-pole lens sequence 600 would be completely illuminated by electrons and insulating components there could be charged and lead to a deterioration in the imaging quality. However, insulating components could be covered and charging could be prevented using a further multi-aperture plate upstream of the multi-pole lens sequence 600. The openings in this additional multi-aperture plate could be chosen to be larger than the openings in the multi-aperture plate 380 such that only the openings in the multi-aperture plate 380 act as selecting openings.

A collimation lens system or condenser lens system 303 often makes use of magnetic fields which cause a Larmor rotation in the charged particles passing through the lens system and consequently cause a screwed profile of the particle trajectories with an overall angle of approximately 50° to 90°. The magnetic field responsible for the screwed path does not suddenly decay upstream of the multi-pole lens sequence 600; instead, there can still be an azimuthal angle of incidence of the particle trajectories. The excitation of the condenser lens system 303 can be chosen in such a way that the particle trajectories enter the multi-pole lens sequence 600 as parallel as possible, i.e., that the polar angle of incidence disappears where possible. However, on account of the spherical aberration of the condenser lens system 303, this is only successful in the region close to the optical axis O, for example; in the edge region of the multi-aperture plate 380, the particle beams are then inclined toward the optical axis O. In order to take account of these circumstances there are, inter alia, the following options:

1. The multi-pole lenses are arranged within the multi-pole lens arrays 601, 602, etc., in such a way that the optical axes of the multi-pole lens groups are adapted to the angle of incidence of the particle beams. However, this only works for a specific configuration of the condenser lens system 303. This would greatly restrict the flexibility of the condenser lens system 303 for adapting the particle current density.

2. A dipole field is used in the first multi-pole lens array 601 in order to bring the particle beam with an inclined incidence onto the optical axis of the multi-pole lens group. Then, a dipole field can likewise be used in the last multi-pole lens array 602 in order to provide the desired inclination for the remaining imaging system. The screwed profile of the particle trajectories within the particle beam still present in the presence of a residual magnetic field can then be taken into account using appropriately oriented quadrupole fields. Although this increases the technical outlay, it develops a comprehensive, additional flexibility for optimizing the overall system.
3. Azimuthal angle of incidence: The residual magnetic field at the location of the multi-pole lens sequence 600 is reduced to the greatest possible extent, be it by way of a sufficient distance from the condenser lens system 303, be it by additional windings for compensation purposes. Polar angle of incidence: The design of the condenser lens system 303 is optimized with respect to a spherical aberration that is as small as possible. These two measures do not lead to a perfect result but sufficiently reduce the problem depending on demand and generate the least technical outlay.
4. A combination of 1 to 3.

Figure 12:
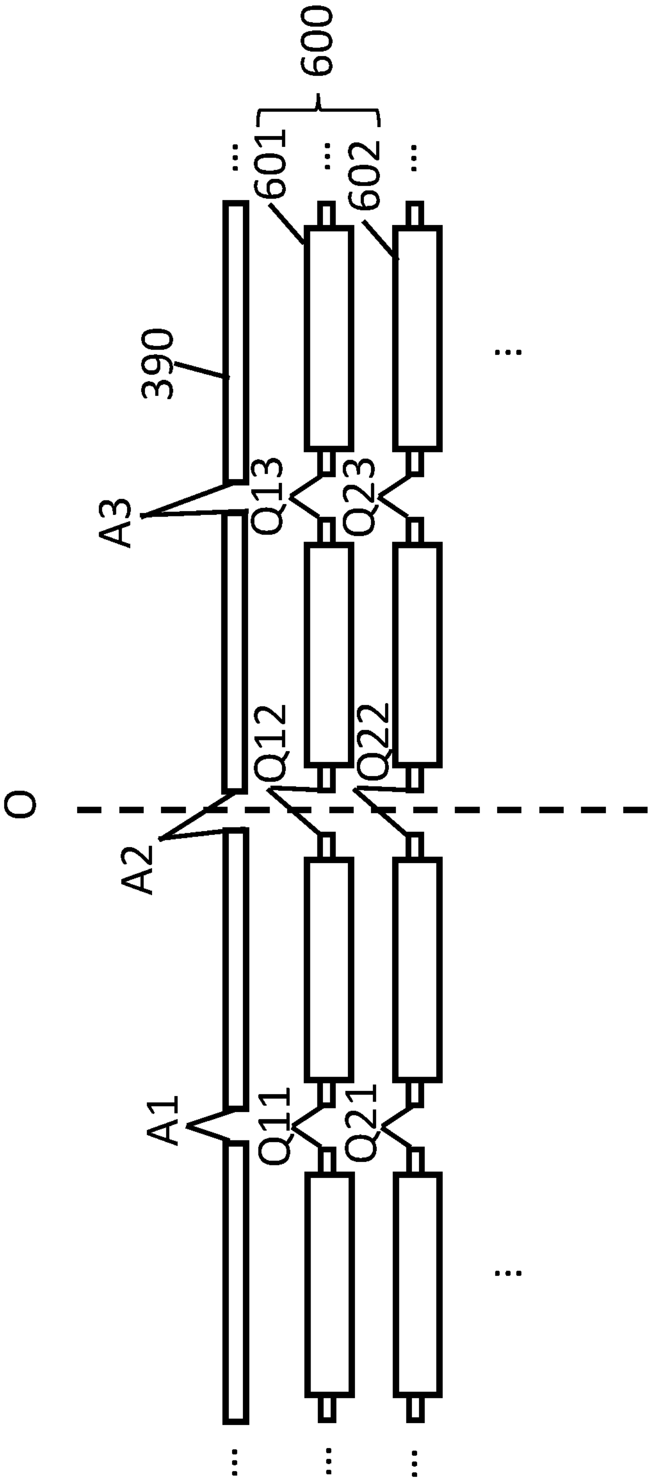
FIG. 12: schematically shows a combination of a multi-aperture plate with elliptical openings with a multi-pole lens sequence.

FIG. 12 schematically shows an embodiment of the disclosure which can be integrated in a multi-beam particle microscope 1 in a manner analogous to FIG. 11. According to this embodiment of the disclosure, provision is made of a multi-aperture plate 390 which, upon incidence by particle beams, generates the individual particle beams 3 during the passage through apertures A1, A2, A3, Ai situated therein. The multi-aperture plate 390 is combined with a multi-pole lens sequence 600, which has a first multi-pole lens array 601 and a second multi-pole lens array 602. In the illustrated case, the lenses of the first multi-pole lens array and the lenses of the second multi-pole lens array 601 and 602 are true quadrupole lenses Q11, Q12, Q13, Q1*i* and Q21, Q22, Q23, Q2*i*, respectively; however, the quadrupole fields could alternatively also be generated by higher-order multi-pole lenses. The integration of further multi-pole lens arrays with quadrupole fields or other multi-pole fields into the illustrated embodiment is naturally possible. However, the cross section of the apertures A1, A2, A3, Ai in the multi-aperture plate 390 now is decisive in this embodiment: This is because the openings in the multi-aperture plate 390 have an elliptical cross section; the only exception in this case is a possible centrally positioned opening, through which the optical axis O of the particle beam system extends. In the case of an appropriate choice of the size and orientation of the elliptical cross sections of the openings, it is possible to take account of the effect of subsequent imaging aberrations in the form of distortion: The emanating particle beam has a round cross section instead of an elliptical cross section.

Figure 13:
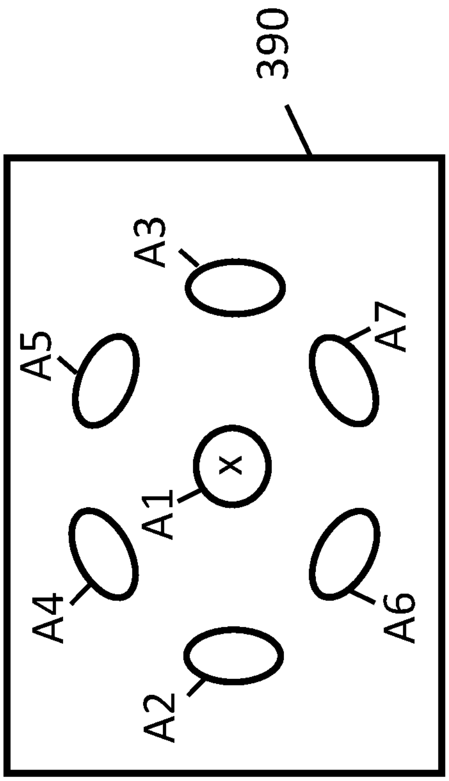
FIG. 13: schematically shows a plan view of the multi-aperture plate with elliptical openings illustrated in FIG. 12.

FIG. 13 schematically shows a plan view of the multi-aperture plate with elliptical openings illustrated in FIG. 12: The central aperture A1 has a round cross section and the optical axis O of the system passes through the centre thereof. The remaining apertures A2 to A7 have an elliptical cross section. Overall, the ellipticity of the openings in the multi-aperture plate 390 in this case increases with increasing distance from the centre of the multi-aperture plate or the central round opening A1 in the multi-aperture plate 390. Here, the orientation of the elliptical openings in the shown example is as follows: If the connection between the centre of the ellipse and the centre of the multi-aperture plate 390 is considered, the major axis of the ellipse passing through the centre is orthogonal to a ray passing radially from the centre of the multi-aperture plate 390 through the centre of the ellipse. Expressed differently, the minor axis of the ellipse is oriented in the radial direction proceeding from the centre of the multi-aperture plate 390. It is self-evident that the multi-aperture plate 390 could have more than the illustrated exemplary seven apertures A1 to A7. Instead, openings can be provided for all individual particle beams present—as already described multiple times above—in a hexagonal arrangement, for example. Moreover, the orientation of the elliptical openings can be different to that illustrated, as described in the general part of the patent application.

Figure 14:
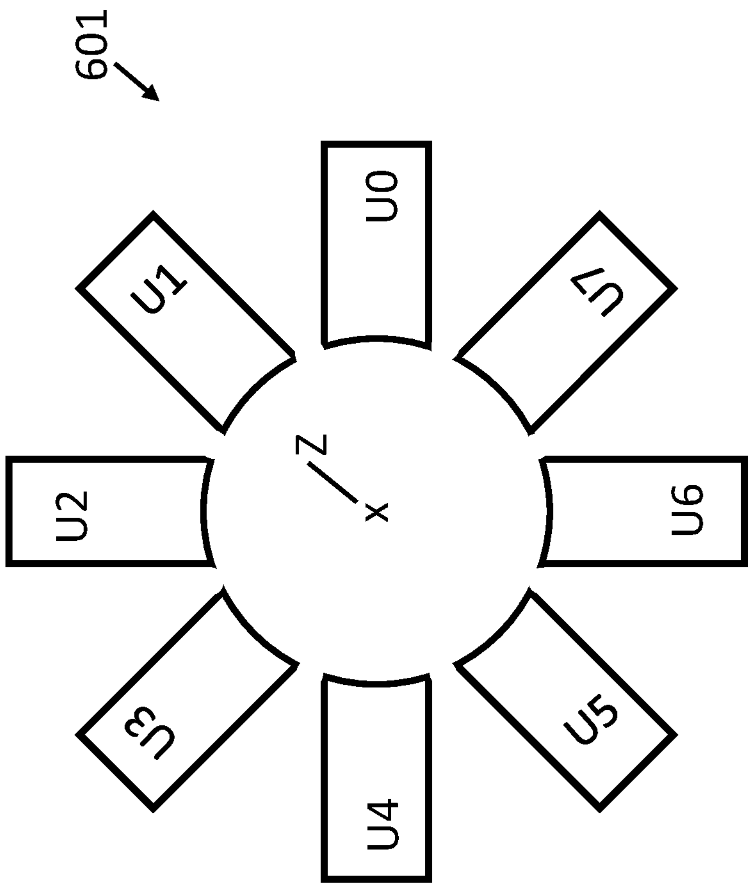
FIG. 14: schematically shows an excerpt of a multi-pole lens array with an octupole electrode arrangement.

FIG. 14 schematically shows an excerpt of a multi-pole lens array 601 with an octupole electrode arrangement. A quadrupole field can likewise be generated with the aid of this octupole electrode arrangement. In general, only the voltages U0=U4=Q and U2=U6=−Q are used to this end. If a further quadrupole field, for example with U1=U5=R and U3=U7=−R, is superposed on this quadrupole field, the overall resultant quadrupole field can be rotated about the optical axis Z. If the task is to slightly vary the orientation of the quadrupole field on account of an existing Larmor rotation or an existing magnetic field, then the voltage R is small in comparison with the voltage Q.

However, the octupole electrode offers even more variation options for the application of multi-pole fields: By way of example, for the purposes of compensating tolerances, it is possible to laterally displace a desired quadrupole field; this can be achieved, for example, by the application of a dipole field by U2=U6=0, U0=−U4=D and U1=−U3=−U5=U7=0.7 D. Moreover, it is naturally possible for this dipole field to likewise be able to be rotated by a different voltage distribution.

It is possible for opposing electrodes to be coupled and be supplied by a single voltage source. This coupling can suppress voltage deviations or voltage differences and undesirable dipole fields possibly arising as a result thereof. What applies in general is that a charged particle beam, for example an electron beam, reacts very sensitively to dipole fields present; i.e., the provided voltages of multi-pole lenses are desirably very stable. It can therefore be desirable to use voltage sources that are already very stable per se. However, the maximum amplitude of the voltage sources can also be chosen to be different for different electrodes. By way of example, it is possible to use voltage sources with a high maximum amplitude for U0=U4 and U2=U6 but use voltage sources with a low maximum amplitude for U1=−U3=−U5=U7. In general, voltage sources with a low maximum amplitude have a smaller, absolute variation or noise width than voltage sources with a high maximum amplitude. It is also still possible to generate a sufficiently strong dipole field with the electrodes U1, U3, U5 and U7 by omitting the dipole component in U0 and U4 (by U0=U4). However, a parasitic hexapole field can arise together with the dipole field due to the missing dipole component in U0 and U4, as a result of which corresponding aberrations also arise; however, this may be acceptable for small amplitudes of the dipole field D. It is also possible to use additional dipole plates with voltage sources with a lower maximum amplitude at other locations; however, appropriate space are then also be provided to this end.

It is also possible to use a voltage source with a high maximum amplitude UQ for both electrodes U0 and U4 and to add two voltage sources UD0 and UD4 with a minimum maximum amplitude thereto. In the a relatively understandable case, the voltage sources UD0 and UD4 are supplied in galvanically isolated fashion and can simply (like batteries) be connected in series to the voltage source UQ: UQ connected in series with UD0 supplies U0; UQ connected in series with UD4 supplies U4. However, this process is quite complicated from a technical point of view and would have to be extended to all electrodes for the general case.

For another technical implementation, the individual sources of noise in a voltage source need to be analysed. This is the reference source, a digitally adjustable divider, one or usually more operational amplifiers and a few resistors. In general, the most noise comes from the reference source and divider; by contrast, if the resistances are chosen to be small enough, the noise of the resistors and the operational amplifiers is negligible. By way of example, use is made of a positive reference source URP with 10 V. A further, negative reference source URN with −10 V is generated therefrom using an inverter, i.e., a 1:1 voltage divider and an operational amplifier. A digitally adjustable divider is used to generate, e.g., the quadrupole voltage UQCP from these two voltages and the inverted counterpart UQCN is immediately also produced using an inverter. This is repeated for 3 further voltages such that the voltages UQCP=−UQCN, UQSP=−UQSN, UDXP=−UDXN, UDYP=−UDYN are obtained, which can all be set in the range between URN and URP. Using a resistor network with downstream amplifiers, these voltages are now distributed among the electrodes of the octupole as follows:

$$U0=A\cdot UQCP+B\cdot UDXP,$$

$$U1=A\cdot UQSP+B\cdot\sqrt{1/2}\cdot UDXP+B\cdot\sqrt{1/2}\cdot UDYP,$$

$$U2=A\cdot UQCN+B\cdot UDYP,$$

$$U3=A\cdot UQSN+B\cdot\sqrt{1/2}\cdot UDXN+B\cdot\sqrt{1/2}\cdot UDYP,$$

$$U4=A\cdot UQCP+B\cdot UDXN,$$

$$U5=A\cdot UQSP+B\cdot\sqrt{1/2}\cdot UDXN+B\cdot\sqrt{1/2}\cdot UDYN,$$

$$U6=A\cdot UQCN+B\cdot UDYN,$$

$$U7=A\cdot UQSN+B\cdot\sqrt{1/2}\cdot UDXP+B\cdot\sqrt{1/2}\cdot UDYN.$$

By way of example, with A=10 and B=1, it is possible to generate a quadrupole voltage with a high maximum amplitude and a dipole voltage with a low maximum amplitude. The noise of the digitally adjustable divider propagates in the quadrupole voltages with a high amplitude. However, the symmetric feedthrough to opposing electrodes ensures that the particle beam position in plane 325 is not noisy. By contrast, the noise of the digitally adjustable dividers only propagates in relative fashion in the dipole voltages, and so the particle beam position only has little noise in plane 325 on account of the low maximum amplitude of the dipole voltages. Since all output voltages are derived from the same reference voltage, the noise of the reference voltage is substantially cancelled out. If a quadrupole voltage is maximally saturated, the symmetric feedthrough to opposing electrodes once again ensures that the particle beam position in plane 325 is not noisy. If a dipole voltage is maximally saturated, the relative noise of the reference source propagates directly to a relative noise of the dipole voltage. However, since the dipole voltage has a low maximum amplitude, the resultant, absolute noise of the beam position is likewise small.

Figure 15:
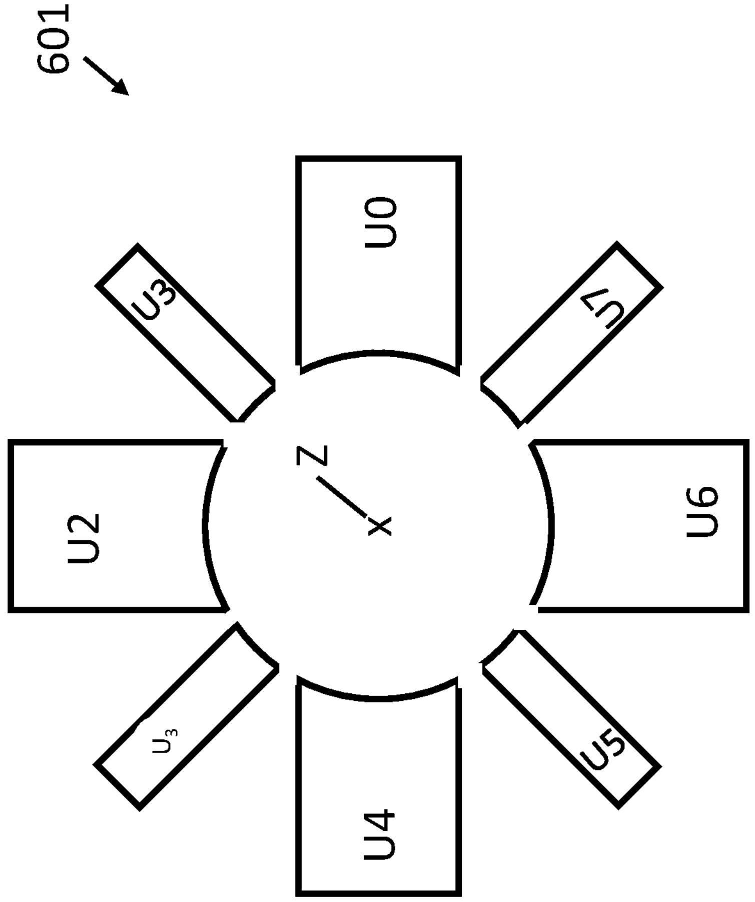
FIG. 15: schematically shows an excerpt of a multi-pole lens array with an alternative octupole electrode arrangement.

FIG. 15 schematically shows an excerpt of a multi-pole lens array 601 with an alternative octupole electrode arrangement. The illustrated electrodes with the voltages U0 to U7 differ in terms of their size or shape. In comparison with the illustration in FIG. 14, some electrodes have increased in size while others have become smaller. Shadowing effects arise by the choice of an appropriate size and shape: The size-reduced electrodes have a weaker effect on the particle beam, even if they are supplied by a voltage source with a high maximum amplitude. It is possible for all electrodes to be supplied by the same type of voltage source but exhibit different effects. For example, a generated quadrupole field can be varied in terms of its orientation. It is also possible to superpose the quadrupole fields on weak dipole fields; however, care has to be taken that the desired homogeneity of the field is nevertheless maintained.

The addressed shadowing principle can also be used in the direction along the optical axis Z: By using an appropriate production method, it is possible to produce multi-pole sequences or multi-pole lenses in a layered structure in the Z-direction. Here, it is possible to connect most of these multi-poles in the form of quadrupoles, with opposing electrodes optionally being coupled. Furthermore, some of the multi-poles can be wired in the form of dipoles, with each electrode then being controllable on an individual basis. Octupoles can also be connected in the form of dipoles, with adjacent electrodes then being coupled (however, this leads again to parasitic hexapole fields). Overall, a stack or sequence of very thin multi-poles or multi-pole lenses can be produced in this way, of which most have quadrupole fields for generating a strong or main quadrupole field, with opposing electrodes optionally being coupled. Moreover, it is possible to wire the multi-poles together in the form of dipoles in order to displace the relative position of the particle beams in relation to the optical axis, for example also to displace these in parallel, and it is possible to provide octupoles in order to orient resultant quadrupole fields in accordance with the desired way. It is also possible to use quadrupoles in order even to generate homogeneous dipole fields. There are many different ways in which multi-pole lens sequences can be generated using multi-pole lens arrays.

Figure 16:
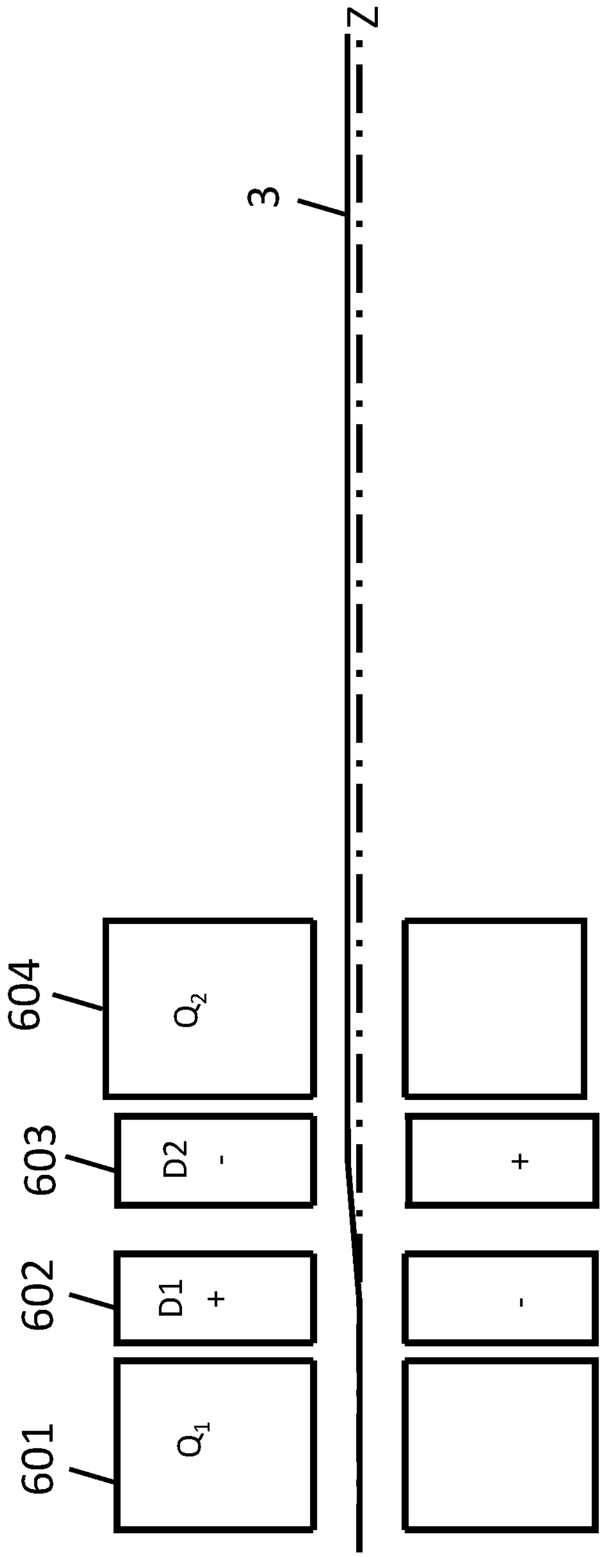
FIG. 16: schematically shows an excerpt of a multi-pole lens sequence with quadrupole and dipole fields.

FIG. 16 schematically shows an excerpt of a multi-pole lens sequence with quadrupole and dipole fields: The illustrated sequence comprises a first multi-pole lens array 601 with a first quadrupole field, a second multi-pole lens array 602 with a first dipole field D1, a third multi-pole lens array 603 with a second dipole field D2 and a fourth multi-pole lens array 604 with a second quadrupole field Q2. Here, the two quadrupole fields Q1 and Q2 are oriented in such a way relative to one another in the shown example that they have an orientation substantially rotated through 90° with respect to one another and substantially the same amplitude. The dipole fields D1 and D2 situated between the two quadrupole fields Q1 and Q2 are aligned in antiparallel fashion with respect to one another and have substantially the same amplitude such that, in general, a parallel offset of the particle beams 3 passing through the multi-pole lens sequence 600 is facilitated. Such a parallel offset allows the particle beam 3 to be guided centrally through all quadrupole fields even though, for example as indicated in FIG. 16, the multi-pole in multi-pole lens array 604 is positioned offset from the optical axis on account of manufacturing errors. Another application of two additional dipole fields would be that of bringing a particle beam that has been screwed by external magnetic fields back to the optical axis of the multi-pole lens sequence before passing through the latter with a first dipole field and of restoring the original direction of the screwed particle beam again at the end. The sequence to this end would be a first multi-pole lens array 601 with a first dipole field D1, a second multi-pole lens array 602 with a first quadrupole field Q1, a third multi-pole lens array 603 with a second quadrupole field Q2 and a fourth multi-pole lens array 604 with a second dipole field D2. Naturally, combinations with, e.g., 4 dipole fields and 2 quadrupole fields in 6 multi-pole lens arrays are also possible.

Here, for a stable particle beam position in plane 325, it can be desirable to wire together the two multi-poles, which are each excited as dipoles in opposite fashion, with wires crossed and connect these together to a voltage supply. As a result, a noise in this voltage supply only generates a noise in the parallel offset and not a noise of the output angle. Since the plane 325 is far away from the dipoles in relation to the distance of the dipole fields, a noise of the output angle in comparison to the noise of the parallel offset would lead to a multiple of noise levels in the particle beam position in plane 325. Such a doublet of dipoles connected with wires crossed can be, for example, part of a multi-layered multi-pole lens sequence and can be used, for example if the integration of the dipole fields together with the quadrupole fields in a multi-pole has too many undesirable features.

Figure 17:
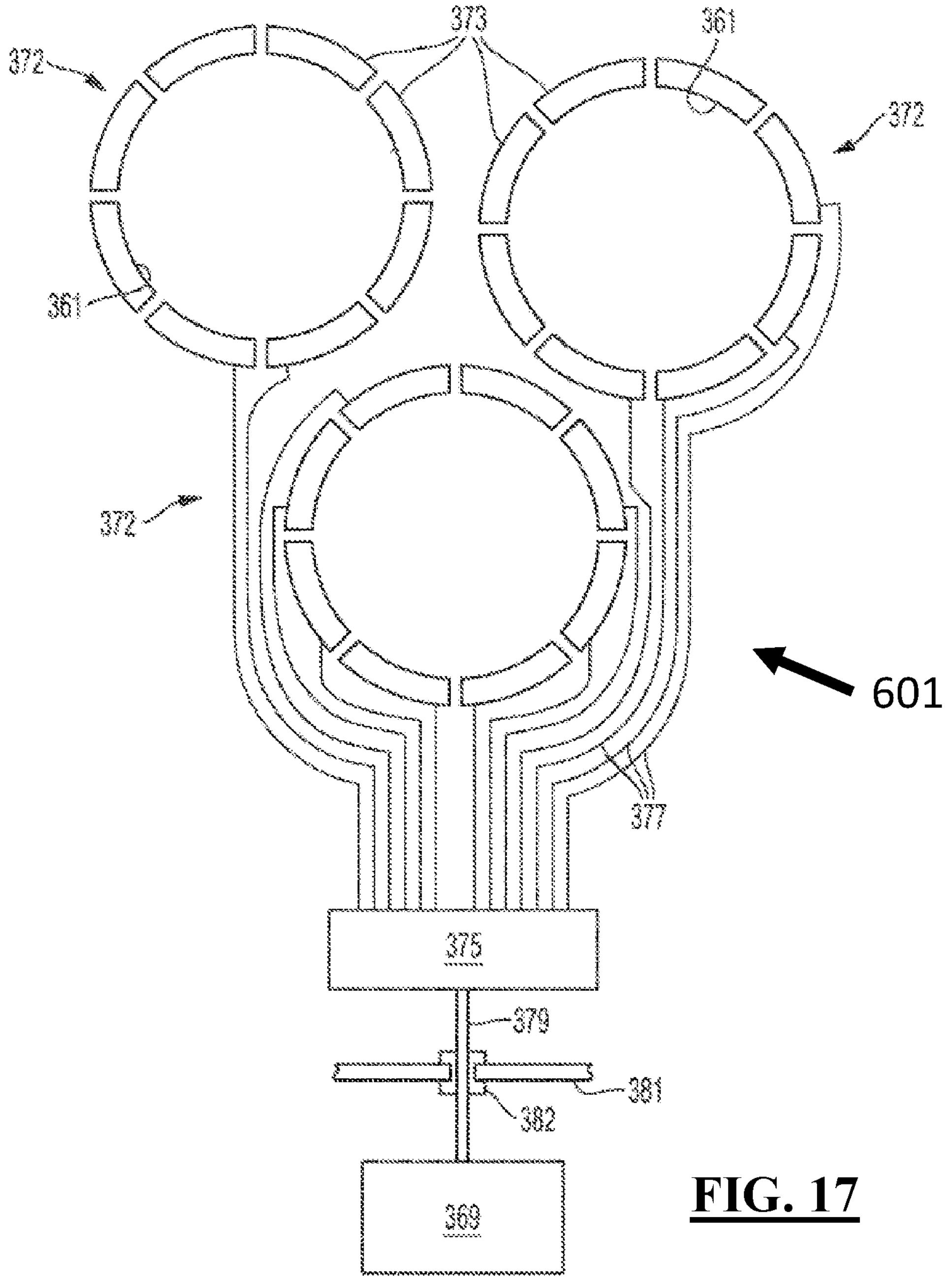
FIG. 17: schematically illustrates a voltage supply for a multi-pole lens array.

FIG. 17 schematically illustrates a voltage supply of a multi-pole lens array 601. Part of a plan view of a multi-pole lens array 601 is illustrated schematically in FIG. 17. A field generator 372 is assigned to each of the openings 361 in order to generate a quadrupole field (and/or other multi-pole fields), which acts on the beam 3 passing through this opening 361. Each field generator 372 has eight electrodes 373, which are arranged distributed around the opening 361 in the circumferential direction and which are controlled by the controller 369. To this end, an electronic circuit 375 which generates adjustable voltages and supplies these to the electrodes 373 via lines 377 is arranged on the plate of the multi-pole lens array 601 in a region arranged at a distance from the openings 361. The controller 369 controls the electronic circuit 375 by way of a serial data connection 379, which passes through a vacuum jacket 381 of the particle beam system. Here, a seal 382 is provided, which seals the lines of the serial data connection in relation to the vacuum jacket 381. The electronic circuit 375 generates the voltages supplied to the electrodes 373 via the lines 377 on the basis of the data received from the controller 369 via the serial data connection 379. Consequently, the controller 369 is able to generate an electric quadrupole field (and/or other multi-pole fields) in each of the openings 361, the field being adjustable with respect to its strength and its orientation about a centre of the opening 361. Using these quadrupole fields (and/or other multi-pole fields), it is possible to manipulate all of the particle beams 3 on an individual basis in each case. The controller 369 sets the quadrupole fields of the multi-pole lens array 601 and the quadrupole fields (and/or other multi-pole fields) of one or more other multi-pole lens arrays 60*i* (not illustrated) in such a way that the focal length of the individual particle beams 3 is selectable on an individual basis and thus, for example, a field curvature in the multi-beam particle beam system is correctable on an individual basis for each individual particle beam.

To construct a layered multi-pole lens array system as discussed on the basis of FIG. 16, the multi-pole lens array 601 as per FIG. 17 can be constructed sequentially using optical-chemical methods known from semiconductor technology and consequently a multi-pole lens sequence 600 can be produced (e.g., MEMS technology). By way of example, through holes can be placed around the electrodes 373 for more effective contacting, the through holes being connected to the electronic circuit 375 via lines 377 at a suitable location or in a suitable layer. Then, depending on the layer, the electrodes 373 can be connected to the corresponding multi-pole group in direct fashion or with wires crossed.

Using the same technology, it would also be possible in a stack of sub-multi-pole lens arrays consisting of, e.g., 21 layers to connect eleven layers to a quadrupole group and ten layers (without wires crossed) to a dipole group in an alternating sequence, for example in order to produce the multi-pole lens array 601. It would be possible to generate in this multi-pole a strong quadrupole field which does not lead to a noisy particle beam position in plane 325 and to overlay thereon a weak dipole field which at most leads to a weakly noisy particle beam position in plane 325.

Further details in relation to the manufacture and voltage supply of multi-lens arrays, which can be transferred to the voltage supply of multi-pole lens arrays, emerge from the German patent application DE 10 2020 106 801.8, which was not yet published at the priority date of this patent application and the disclosure of which is incorporated in its entirety in this patent application.

Using the multi-pole lens sequence as per the exemplary embodiments, an independent lens effect or focus setting for individual particle beams, for example for field curvature correction, is obtained at lower voltages than when lenses with ring electrodes are used. The exemplary embodiments explain the disclosure using the example of field curvature correction; however, the disclosure is not restricted to field curvature correction. In another example, the focal length is noticeably reduced at a lower voltage than in the case of ring electrodes, for example by more than 10%, such as 20%, and the numerical aperture is noticeably increased, for example by more than 10%, such as 20%. Further, the disclosure renders possible the independent and stronger lens effect or focus setting with a shorter focal length for individual particle beams for a greater multiplicity of particle beams since the voltages for the multi-pole lens sequence are lower and hence interaction effects, which occur for example in the case of the voltage supply of a great multiplicity of multi-pole electrodes for a great multiplicity of individual particle beams, are lower. By way of example, a great multiplicity of individual particle beams can comprise a multiplicity of one hundred, three hundred or more individual particle beams. With the lower voltages of, e.g., less than 300 V, for example less than 200 V, such as less than 100 V, each individual particle beam of a greater multiplicity of individual particle beams can be focussed independently and individually; for example, a first individual particle beam can be focussed more strongly than an adjacent, second individual particle beam. Using the lower voltages, an adjustment of a focal length difference between adjacent individual particle beams is facilitated even with lower voltage differences; by way of example, the focal length difference between a first individual particle beam and a second individual particle beam can be greater than 10%, wherein the voltage differences between the multi-pole electrodes of the first and second individual particle beam are less than 100 V, for example less than 50 V, such as approximately 20 V.

What is claimed is:

1. A particle beam system, comprising:

a multiple beam particle source configured to generate a multiplicity of charged individual particle beams;

a multi-pole lens sequence comprising first and second multi-pole lens arrays, the first multi-pole lens array comprising a multiplicity of individually adjustable first multi-pole lenses configured to generate a first quadrupole field, the first multi-pole lens array in a beam path of the multiplicity of charged individual particle beams so that charged individual particle beams of the multiplicity of charged individual particle beams substantially pass through the first multi-pole lens array, the second multi-pole lens array comprising a multiplicity of individually adjustable second multi-pole lenses configured to generate a second quadrupole field, the second multi-pole lens array in the beam path of the multiplicity of charged individual particle beams so that the charged individual particle beams of the multiplicity of charged individual particle beams which pass through the first multi-pole lens array substantially also pass through the second multi-pole lens array; and a controller, wherein:

for each charged individual particle beam of the multiplicity of charged individual particle beams, the charged individual particle beam passes through a sequence of multi-pole lenses of the first and second multi-pole lens arrays which define a group of multi-pole lenses for the charged individual particle beam;

the controller is configured to control generation of the first and second quadrupole fields so that, for each charged individual particle beam of the multiplicity of charged individual particle beams that passes through its group of multi-pole lenses of the multi-pole lens sequence, the group of multi-pole lenses collectively exerts a stigmatic focusing effect on the charged individual particle beam; and the controller is configured to control multi-pole fields generated by the multi-pole lenses of the multi-pole lens sequence to exert an effect on the multiplicity of charged individual particle beams so that foci of the multiplicity of charged individual particle beams are located on a concave surface downstream of the multi-pole lens sequence.

2. The particle beam system of claim 1, wherein at least one of the following holds:

a quadrupole of the first quadrupole field and a quadrupole of the second quadrupole field are oriented at substantially 90° with respect to one another; and the quadrupole of the first quadrupole field and the quadrupole of the second quadrupole field substantially have the same amplitude.

3. The particle beam system of claim 1, wherein at least one member selected from the group consisting of the first multi-pole lens array and the second multi-pole lens array comprises a quadrupole lens array.

4. The particle beam system of claim 1, wherein:

the multi-pole lens sequence further comprises a third multi-pole lens array;

the third multi-pole lens array comprises a multiplicity of individually adjustable third multi-pole lenses configured to generate a third quadrupole field;

the third multi-pole lens array is in the beam path of the multiplicity of charged individual particle beams between the first second multi-pole lens arrays so that the charged individual particle beams of the multiplicity of charged individual particle beams which pass through the first multi-pole lens array substantially also pass through the third multi-pole lens array; and the controller is configured to control the multi-pole lenses of the multi-pole lens sequence so that, for each charged individual particle beam of the multiplicity of charged individual particle beams that passes through its group of multi-pole lenses of the multi-pole lens sequence, the group of multi-pole lenses of the multi-pole lens sequence collectively exerts an effect on the charged individual particle beam so that imaging of the charged individual particle beam in a focal plane has a reduced distortion.

5. The particle beam system of claim 4, wherein:

quadrupoles of the first and second multi-pole lens arrays belonging to the same group of multi-pole lenses have substantially the same orientation and substantially the same amplitude;

a quadrupole of the third multi-pole lens array belonging to the same group of multi-pole lenses is oriented at approximately 90° with respect to the quadrupoles of the first and second multi-pole lens arrays; and an amplitude of the quadrupole of the third multi-pole lens array is greater than an amplitude of each of the quadrupoles of the first and second multi-pole lens arrays for each group of multi-pole lenses.

6. The particle beam system of claim 4, wherein:

the multi-pole lens sequence comprises a fourth multi-pole lens array;

the fourth multi-pole lens array comprises a multiplicity of individually adjustable fourth multi-pole lenses configured to generate a fourth quadrupole field;

the fourth multi-pole lens array is in the beam path of the multiplicity of charged individual particle beams between the first and second multi-pole lens arrays so that the charged individual particle beams of the multiplicity of charged individual particle beams which pass through the first multi-pole lens array substantially also pass through the fourth multi-pole lens array;

the controller is configured to control the multi-pole lenses of the multi-pole lens sequence so that, for each charged individual particle beam of the multiplicity of charged individual particle beams that passes through its group of multi-pole lenses of the multi-pole lens sequence, the group of multi-pole lenses collectively exerts an effect on the charged individual particle beam so that imaging of the charged individual particle beam in the focal plane has the reduced distortion, even when focusing through.

7. The particle beam system of claim 6, wherein:

quadrupoles of the first and second multi-pole lens arrays belonging to the same group of multi-pole lenses have the same amplitude and are oriented at substantially 90° with respect to one another;

quadrupoles of the third and fourth multi-pole lens arrays belonging to the same group of multi-pole lenses have the same amplitude and are oriented at substantially 90° with respect to one another;

a sequence of polarities of the quadrupoles belonging to the same group of multi-pole lenses alternates;

the amplitude of the quadrupole of the third multi-pole lens array is greater than the amplitude of the quadrupole of the first multi-pole lens array for each group of multi-pole lenses; and the amplitude of the quadrupole of the fourth multi-pole lens array is greater than the amplitude of the quadrupole of the second multi-pole lens array for each group of multi-pole lenses.

8. The particle beam system of claim 1, wherein at least one of the multi-pole lens arrays comprises an octupole lens array.

9. The particle beam system of claim 8, wherein the controller is configured to control the octupole lenses of the octupole lens array so that an electric field generated by the octupole electrodes of the octupole lenses of the octupole lens array provides a superposition of two quadrupole fields that substantially results in a quadrupole field that is rotated about a main axis of a particular charged individual particle beam of the multiplicity of charged individual particle beams with respect to one of the quadrupole fields.

10. The particle beam system of claim 8, wherein all electrodes of an octupole lens of the octupole lens array have the same size and shape.

11. The particle beam system of claim 8, wherein at least some of the electrodes of an octupole lens of the octupole lens array have different sizes and/or different shapes.

12. The particle beam system of claim 1, wherein:

the controller is configured to control the multi-pole lenses of the multi-pole lens sequence so that an electric field generated by multi-pole electrodes of the multi-pole lens array provides a superposition of a quadrupole field and at least one dipole field; and the superposition of the at least one dipole field with respect to the quadrupole field results in a quadrupole field that is displaced from a geometric axis of the individual multi-pole lenses forming the superposition.

13. The particle beam system of claim 1, wherein the multi-pole lens sequence further comprises a dipole lens array and an additional multi-pole lens array.

14. The particle beam system of claim 13, wherein:

the first and second multi-pole lens arrays and the dipole lens array and the additional multi-pole lens array are configured to generate the following field sequence: a first dipole field; a quadrupole field; a further quadrupole field; and a second dipole field; and an orientation of the second dipole field is different from an orientation of the first dipole field.

15. The particle beam system of claim 13, wherein the first and second multi-pole lens arrays and the dipole lens array and the additional multi-pole lens array are configured to generate the following field sequence: a quadrupole field; at least two dipole fields with different orientations with respect to one another; and a further quadrupole field.

16. The particle beam system of claim 1, wherein the multiple beam particle source comprises:

a particle source configured to generate a beam of charged particles; and a multi-aperture plate comprising a multiplicity of openings in a beam path of the beam of charged particles so that at least some of the charged particles in the beam of charged particles pass through the openings in the multi-aperture plate to form the multiplicity of charged individual particle beams.

17. A multi-beam particle microscope, comprising:

the particle beam system of claim 1; and a detector system.

18. A method, comprising:

using the particle beam system of claim 1 to correct field curvature.

19. A method, comprising:

using the particle beam system of claim 1 to correct astigmatism that varies across an image field of oblique bundles of the multiplicity of charged individual particle beams via control of one or both of the generated first and second quadrupole fields of the first and second multi-pole lens arrays.

20. The particle beam system of claim 1, wherein the controller is configured to control the generation of the first and second quadrupole fields so that for each charged individual particle beam of the multiplicity of charged individual particle beams that passes through its group of multi-pole lenses of the multi-pole lens sequence:

the group of multi-pole lenses collectively exerts a focusing effect on the charged individual particle beam in first and second directions;

the first direction is orthogonal to a main axis of the charged individual particle beam;

the second direction is orthogonal to both the first direction and the main axis of the charged individual particle beam; and components of the charged individual particle beam which enter the group of multi-pole lenses of the multi-pole sequence parallel to the main axis of the charged individual particle beam are collectively focused in the first and second directions to meet at a focus on the main axis of the charged individual particle beam.

21. A particle beam system, comprising:

a multiple beam particle source configured to generate a multiplicity of charged individual particle beams;

a multi-pole lens sequence comprising first and second multi-pole lens arrays, the first multi-pole lens array comprising a multiplicity of individually adjustable first multi-pole lenses configured to generate a first quadrupole field, the first multi-pole lens array in a beam path of the multiplicity of charged individual particle beams so that charged individual particle beams of the multiplicity of charged individual particle beams substantially pass through the first multi-pole lens array, the second multi-pole lens array comprising a multiplicity of individually adjustable second multi-pole lenses configured to generate a second quadrupole field, the second multi-pole lens array in the beam path of the multiplicity of charged individual particle beams so that the charged individual particle beams of the multiplicity of charged individual particle beams which pass through the first multi-pole lens array substantially also pass through the second multi-pole lens array; and a controller, wherein:

for each charged individual particle beam of the multiplicity of charged individual particle beams, the charged individual particle beam passes through a sequence of multi-pole lenses of the first and second multi-pole lens arrays which define a group of multi-pole lenses for the charged individual particle beam; and the controller is configured to control the generation of the first and second quadrupole fields so that for each charged individual particle beam of the multiplicity of charged individual particle beams that passes through its group of multi-pole lenses of the multi-pole lens sequence:

the group of multi-pole lenses collectively exerts a focusing effect on the charged individual particle beam in first and second directions;

the first direction is orthogonal to a main axis of the charged individual particle beam;

the second direction is orthogonal to both the first direction and the main axis of the charged individual particle beam;

components of the charged individual particle beam which enter the group of multi-pole lenses of the multi-pole sequence parallel to the main axis of the charged individual particle beam are collectively focused in the first and second directions to meet at a focus on the main axis of the charged individual particle beam; and the controller is configured to control multi-pole fields generated by the multi-pole lenses of the multi-pole lens sequence to exert an effect on the multiplicity of charged individual particle beams so that foci of the multiplicity of charged individual particle beams are located on a concave surface downstream of the multi-pole lens sequence.

* * * * *